(12) United States Patent
Nagai

(10) Patent No.: US 9,064,877 B2
(45) Date of Patent: Jun. 23, 2015

(54) SEMICONDUCTOR WAFER AND METHOD OF TESTING THE SAME

(75) Inventor: Kouichi Nagai, Kawasaki (JP)

(73) Assignee: FUJITSU SEMICONDUCTOR LIMITED, Yokohama (JP)

(*) Notice: Subject to any disclaimer, the term of this patent is extended or adjusted under 35 U.S.C. 154(b) by 625 days.

(21) Appl. No.: 11/829,388

(22) Filed: Jul. 27, 2007

(65) Prior Publication Data

US 2008/0036485 A1 Feb. 14, 2008

(30) Foreign Application Priority Data

Aug. 9, 2006 (JP) .................................. 2006-216838

(51) Int. Cl.
*H01L 23/544* (2006.01)
*H01L 21/66* (2006.01)
*G01R 31/28* (2006.01)

(52) U.S. Cl.
CPC .......... *H01L 23/544* (2013.01); *G01R 31/2891* (2013.01); *H01L 22/20* (2013.01); *H01L 2223/5442* (2013.01); *H01L 2223/54426* (2013.01); *H01L 2223/5446* (2013.01)

(58) Field of Classification Search
CPC ................. H01L 23/544; H01L 22/20; H01L 2223/5442; H01L 2223/54426
USPC ....................... 257/48, 209, 690–797; 437/62; 438/238, 460, 462; 430/5
See application file for complete search history.

(56) References Cited

U.S. PATENT DOCUMENTS

| | | | | |
|---|---|---|---|---|
| 4,343,877 A * | 8/1982 | Chiang | .............................. | 430/5 |
| 5,206,181 A * | 4/1993 | Gross | .............................. | 438/18 |
| 5,369,050 A * | 11/1994 | Kawai | .............................. | 438/401 |
| 5,733,690 A * | 3/1998 | Jeong et al. | .............................. | 430/5 |
| 6,303,423 B1 * | 10/2001 | Lin | .............................. | 438/238 |
| 6,940,107 B1 * | 9/2005 | Cheng et al. | .............................. | 257/209 |
| 2001/0050437 A1 * | 12/2001 | Saito | .............................. | 257/758 |
| 2003/0216009 A1 * | 11/2003 | Matsuura et al. | .............................. | 438/460 |
| 2005/0269702 A1 * | 12/2005 | Otsuka | .............................. | 257/750 |
| 2005/0282360 A1 * | 12/2005 | Kida et al. | .............................. | 438/462 |
| 2006/0022195 A1 * | 2/2006 | Wang | .............................. | 257/48 |
| 2006/0103408 A1 * | 5/2006 | Takahashi et al. | .............................. | 324/765 |
| 2007/0023932 A1 * | 2/2007 | Sogawa et al. | .............................. | 257/797 |

FOREIGN PATENT DOCUMENTS

| | | | |
|---|---|---|---|
| JP | 200283784 A | | 3/2002 |
| JP | 20037604 A | | 1/2003 |
| JP | 2003304098 A | | 10/2003 |

* cited by examiner

*Primary Examiner* — Eugene Lee
*Assistant Examiner* — Fang-Xing Jiang
(74) *Attorney, Agent, or Firm* — Westerman, Hattori, Daniels & Adrian, LLP

(57) ABSTRACT

The present invention provides a semiconductor wafer characterized by including: a silicon substrate which includes chip regions and scribe regions; multiple-layered films formed on the silicon substrate; and a reference mark formed in at least one film constituting the multiple-layered films. In addition, the semiconductor wafer is also characterized in that the reference mark is located at least one of the vertices of a virtual rectangle covering the plurality of chip regions, and in that the reference mark is longer than one side of each of the chip regions.

10 Claims, 42 Drawing Sheets

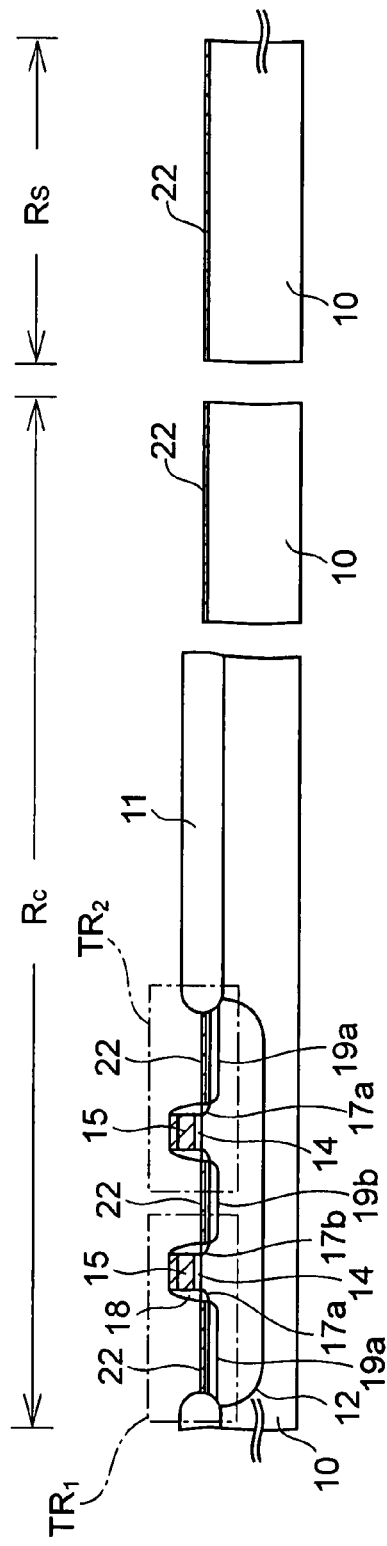
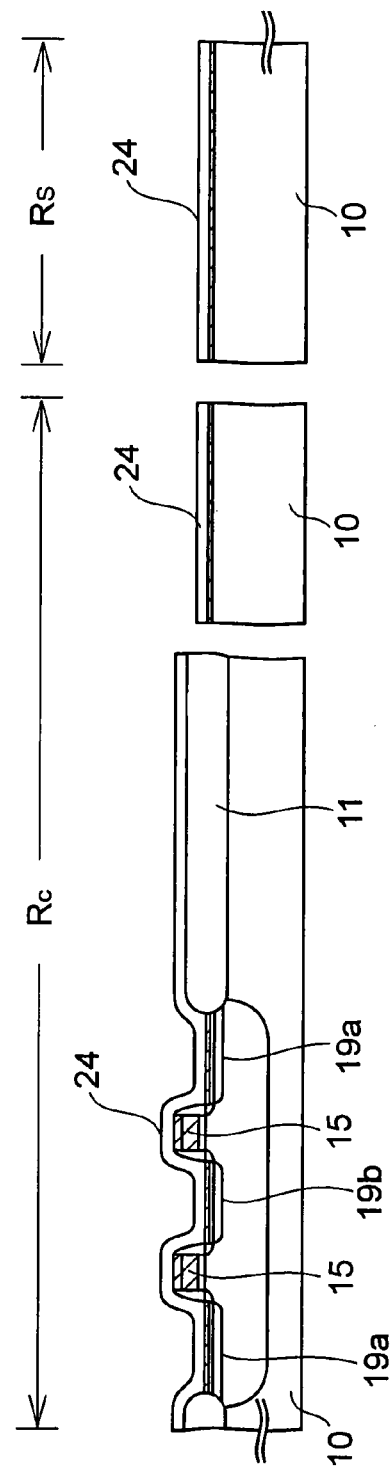

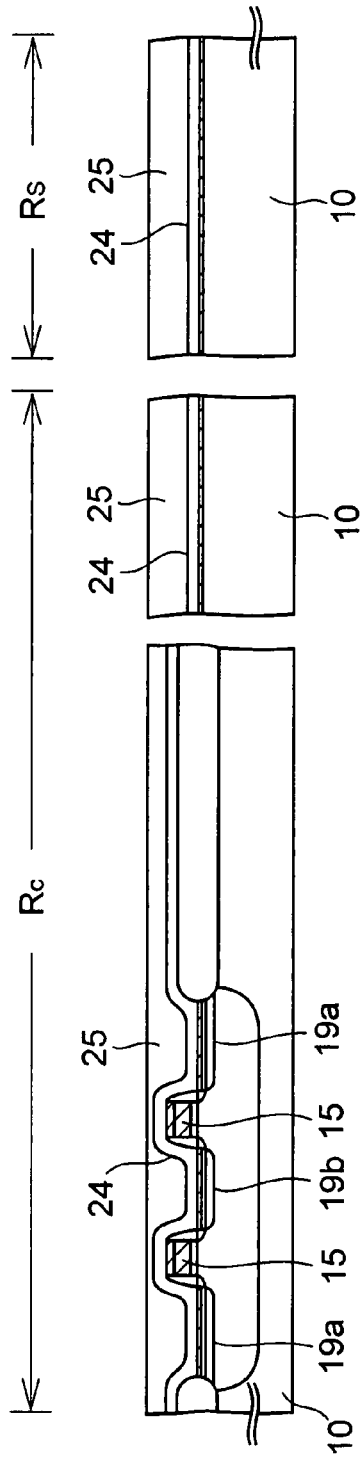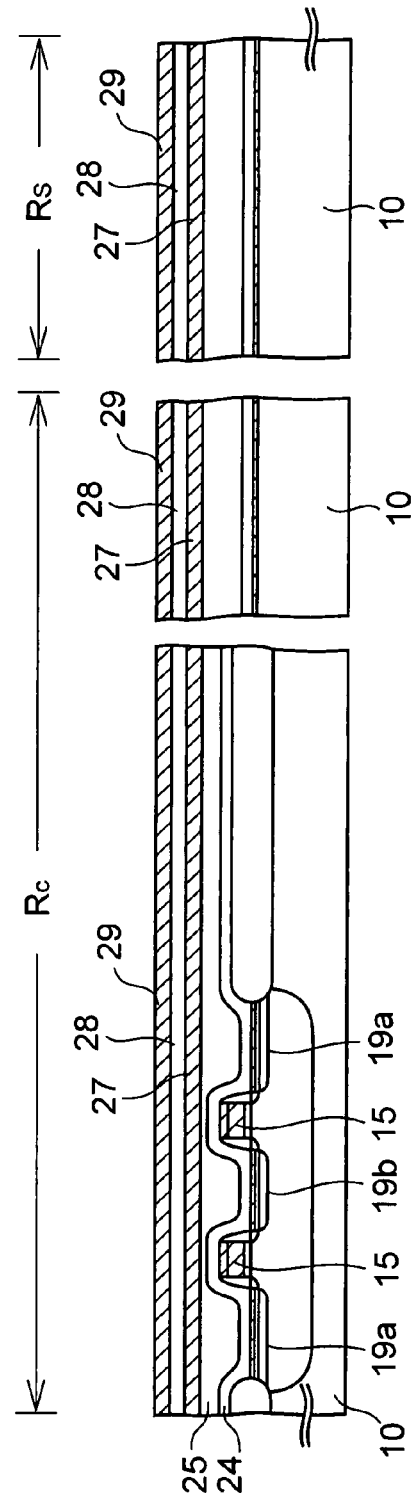

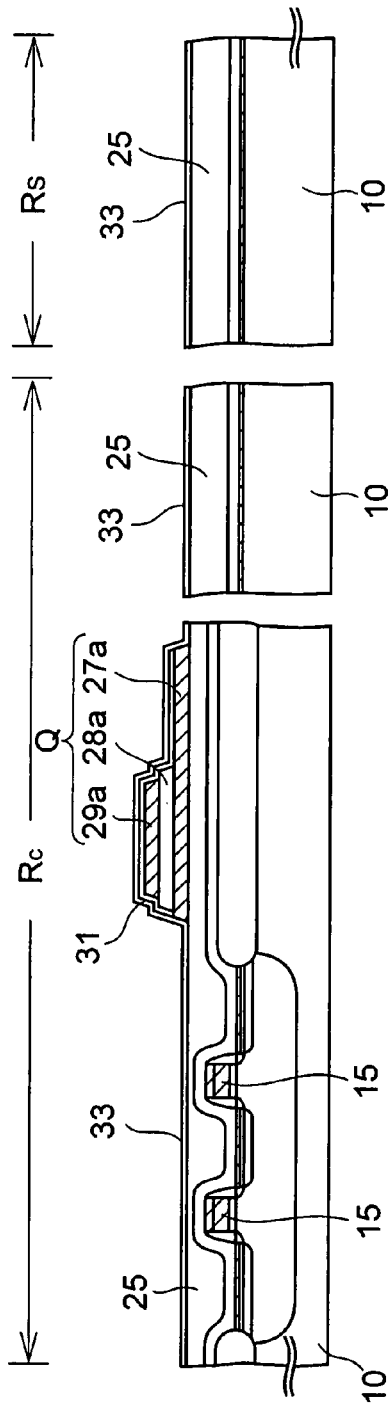
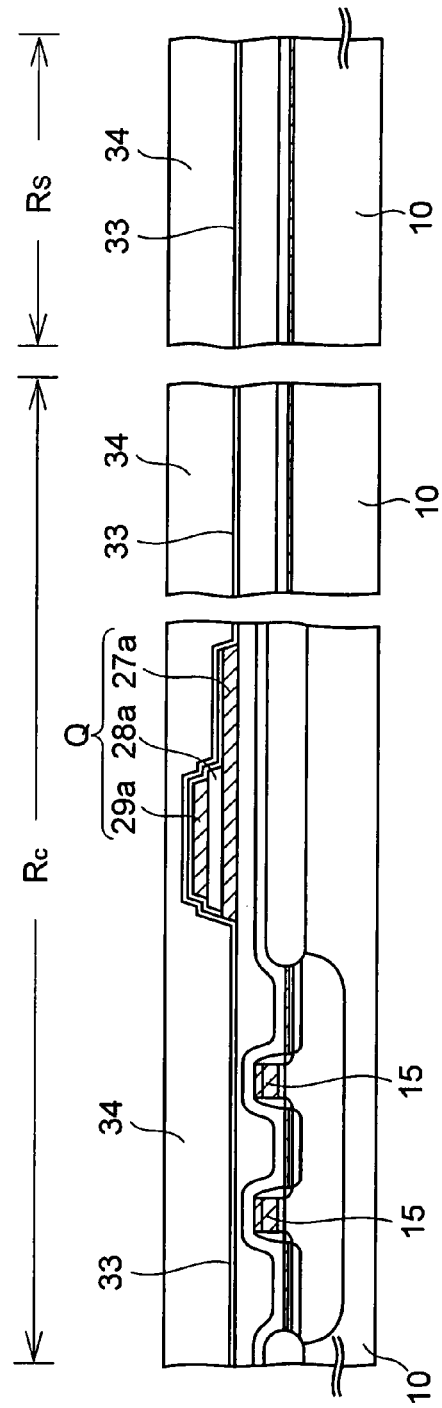
FIG. 1I
FIG. 1J

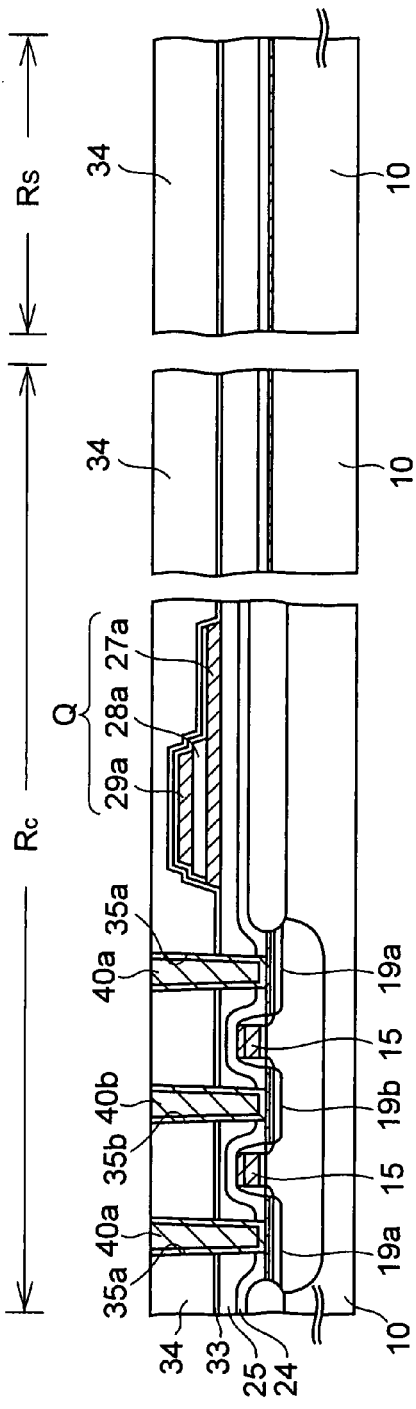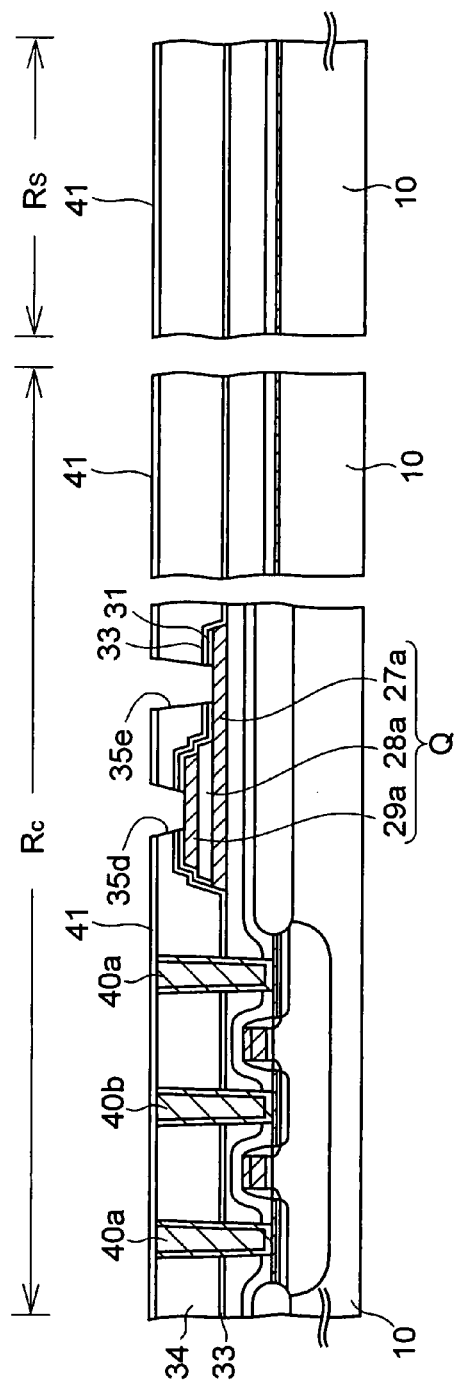

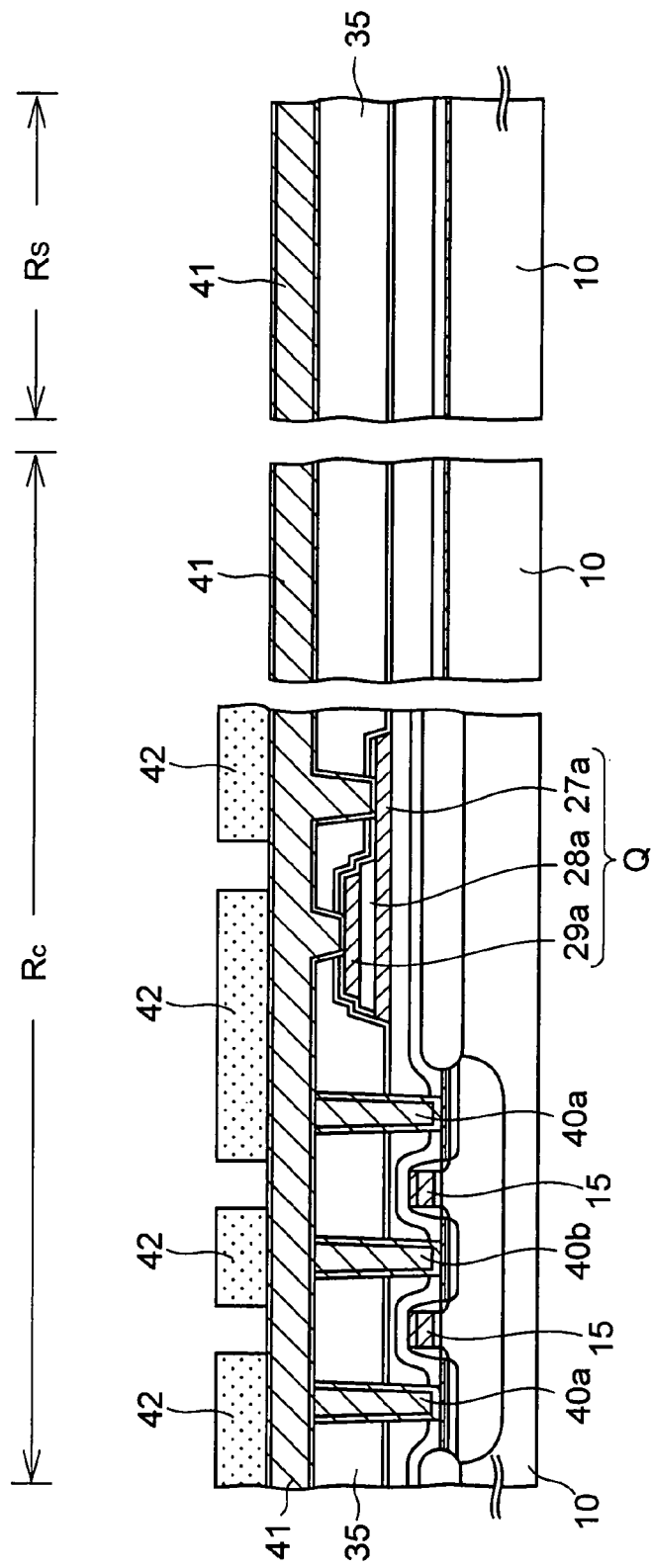

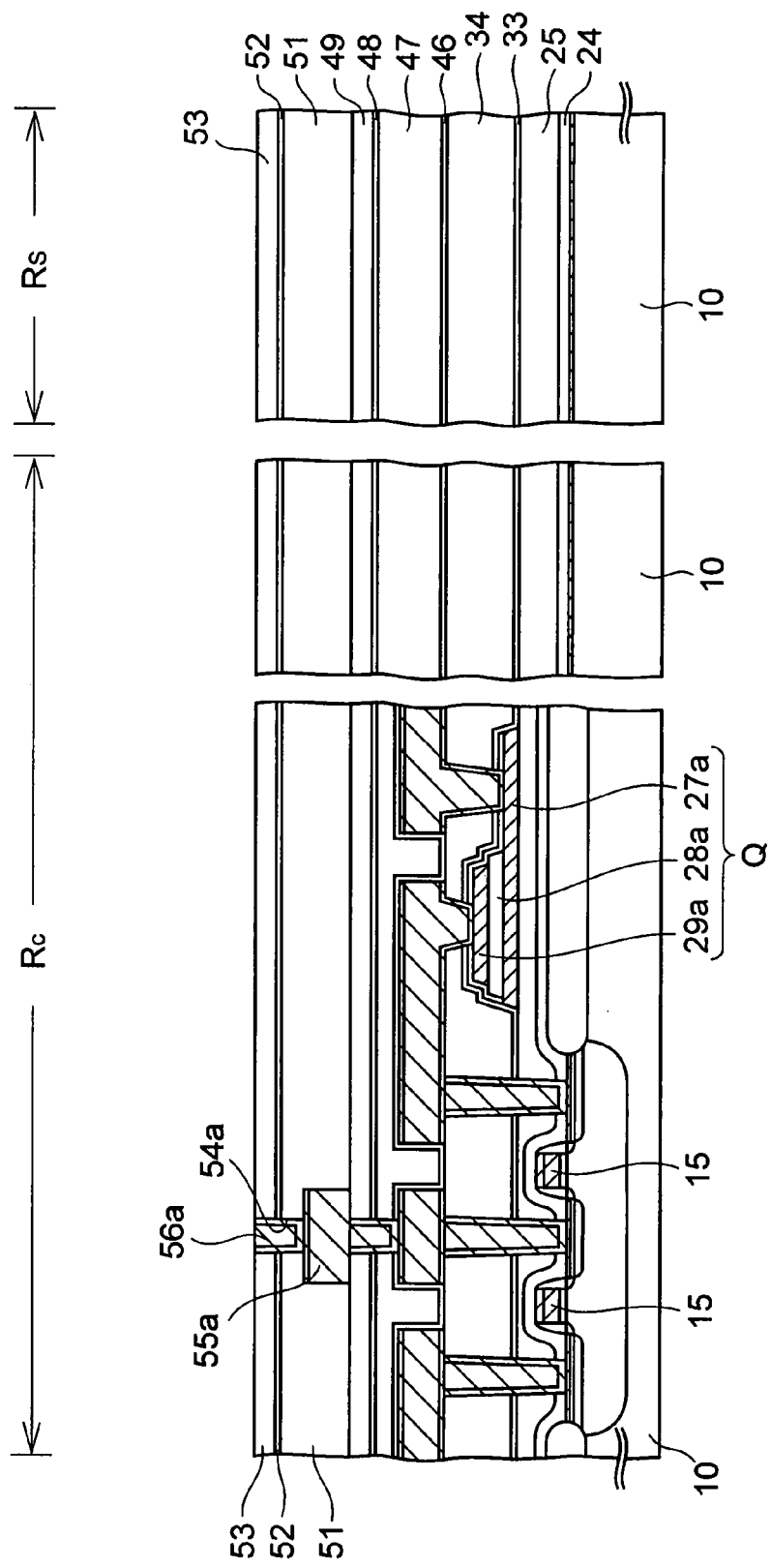

SEMICONDUCTOR WAFER AND METHOD OF TESTING THE SAME

CROSS-REFERENCE TO RELATED APPLICATIONS

This application is based on and claims priority of Japanese Patent Application No. 2006-216838 filed on Aug. 9, 2006, the entire contents of which are incorporated herein by reference.

BACKGROUND OF THE INVENTION

1. Field of the Invention

It is related to a semiconductor wafer and a method of testing the same.

2. Description of the Related Art

These years, an increasingly wide use of portable electric appliances as well as an increasingly strong request for energy savings and reduction of industrial waste has intensified a demand for semiconductor devices, which include a non-volatile memory in which data is capable of being rewritten, and which retains data even when the power supply is turned off.

Examples of non-volatile memories include an EEPROM (Electric Erasable Programmable Read Only Memory) and a FeRAM (Ferroelectric Random Access Memory). Examples of a test to be carried out after completing these memories include an electrical test (retention test) for checking on whether or not data disappears after heating these memories up to a predetermined temperature. In some cases, this electrical test may be carried out after sealing a memory in a plastic package or after the assembling step. However, the test is usually carried out at the wafer level in order to classify non-defective chip and defective chip, since the wafer level testing can be carried out at higher temperature for a short time with low cost.

A result of the wafer level testing is visible in the form of a wafer map. Then, in a post-process, only non-defective chips are selected from the wafer based on the wafer map, and defective chips are discarded.

If, however, the semiconductor wafer is not aligned with the testing equipment, some inconveniences arise. For example, when the test is intended to perform on the chip A, chip B adjacent to the chip A might be unsuccessfully tested, so that non-defective chip and defective chip might be confusedly mishandled. If this is the case, defective chips are handled as non-defective chips in the post-process, or non-defective chips might be discarded as defective chips.

To deal with this problem, it is necessary in the wafer level testing to precisely grasp the location of semiconductor chip to be tested in the semiconductor wafer by, for example, aligning the semiconductor wafer and test equipment, while forming the reference mark formed in the particular region of the semiconductor and using the reference mark as a clue.

In the conventional example disclosed in Japanese Patent Application Laid-open Publication No. 2003-7604 (hereinafter referred to as "JPA No. 2003-7604"), a test is carried out by using a "process assessment pattern" formed in a particular position in a semiconductor wafer as the clue.

However, this method brings about such a problem that a region available for product chip is reduced by the region for the "process assessment pattern", so that process cost for manufacturing the semiconductor device increases.

Another method of locating the chip to be tested in the semiconductor wafer is to count the number of chips from a periphery of the semiconductor wafer. However, a counting error is likely to take place in this method.

Taking these into consideration, JPA No. 2003-7604 is disclosing that, as shown in its FIG. 3, an exposure is carried out while a part of the reticle is intentionally covered with a shutter, and thereby an unfinished pattern is formed in a semiconductor chip which is used as a reference. According to this method, the unfinished pattern electrically insulates a bonding pad from a testing needle. Therefore, a voltage value of the semiconductor chip used as the reference becomes higher than a voltage value of any neighboring semiconductor chip, when read by use of the needle. In JPA No. 2003-7604, the chip used for the reference is distinguished from the neighboring chips.

However, this method brings about such a new problem that the unfinished pattern peels off from the wafer and generates particles, so that yield of the semiconductor chip reduces.

Besides the above-described methods, a method called as "drop shot" is sometimes used to form the reference mark for alignment in the semiconductor wafer. The "drop shot" is a method of making a contrast between a specific region (reference region) and neighboring regions. Such a contrast can be made by, for example, by intentionally getting rid of a part of a pattern in a product chip in the specific area (reference area) in a semiconductor wafer, or by forming a pattern different from those of the product chips in the specific region. When the testing equipment recognizes the difference of the contrast as an image, relative position between the reference area and the testing chip can be recognized, so that chip location in the semiconductor wafer can be grasped.

However, even in the case where the "drop shot" is used, since the pattern different from the product chips is formed in the reference region, the number of the chips that can be dicing out from the semiconductor wafer is reduced, so that the manufacturing cost for the semiconductor device is raised. Furthermore, when the "drop shot" is employed, stacked structure of the films becomes different between the reference region and other region, so that films in the reference region might peel off in some etching conditions.

In addition to JPA No. 2003-7604, Japanese Patent Application Laid-open Publication No. 2003-304098 and Japanese Patent Application Laid-open Publication No. 2002-83784 disclose some techniques relevant to the present application.

SUMMARY OF THE INVENTION

According to one aspect, there is provided a semiconductor wafer comprising: a semiconductor substrate including chip regions and a scribe region; stacked films formed on the semiconductor substrate; and a reference mark formed in at least one of the films constituting the stacked films, wherein the reference mark is located at least one of the vertices of a virtual rectangle encompassing the plurality of chip regions, and the reference mark is longer than one side of the chip region.

According to another aspect, there is provided a method of testing a semiconductor wafer, comprising the steps of: aligning the semiconductor wafer with a testing equipment by recognizing a reference mark formed in the semiconductor wafer by use of an optical microscope; and after the alignment, testing an electrical characteristic of an element formed in a chip region of the semiconductor wafer by contacting a needle to the semiconductor wafer, wherein the reference mark is located at least one of the vertices of a virtual rectangle encompassing the plurality of chip regions, and is longer than one side of the chip region.

Next, operations will be described.

The length of the reference mark, which is used as a clue for aligning the testing equipment and the semiconductor wafer, is formed longer than one side of a chip region. Therefore, even in the case where extremely small semiconductor chips, such as used for IC tags, are integrated in the semiconductor wafer, the reference mark can be clearly recognized, so that the testing equipment and the semiconductor can be precisely aligned.

In addition, when the reference mark is formed in a scribe region of the semiconductor wafer, the same number of chips can be diced out from the semiconductor wafer as the case where the reference mark is not formed.

Here, if the reference mark were to be formed in the stacked films in a chip region, the structure of the chip, in which the reference mark is formed, would be different from that of the other chips in which the reference mark is not formed. Therefore, if an etching condition is optimized for the chip in which the reference mark is formed, films can peel off from the chips in which the reference mark is not formed, so that the yield of the product chip reduces due to the particle originated from the peeled films.

On the contrary, in the present structure, since the reference mark is formed in the scribe region, all of the chips diced out from the semiconductor wafer have the same structure, and hence the reduction in the yield due to the peeled films can be prevented.

Moreover, a plurality of reference marks may be formed in the stacked films in a way that the reference marks overlap with one another. Particularly, in the case where the reference marks are made of transparent films, by overlapping the reference marks in this manner, contrast between the reference marks and their neighbors can be enhanced, so that the reference marks can easily be recognized in the testing equipment.

Note that when the reference mark is formed at a middle height of the stacked films, it is made easy to recognize the reference mark by making the stacked films above the reference mark from transparent films.

In addition, it is preferable that the planer shape of the reference mark be any one of L-shape, T-shape, and cross-shape. By employing these shapes, ratio of the occupying area of the reference mark in the viewing field of the optical microscope increases, so that alignment can easily be performed in the testing equipment.

BRIEF DESCRIPTIONS OF THE DRAWINGS

DESCRIPTION OF THE PREFERRED EMBODIMENTS

Detailed descriptions will be provided next for embodiments of the present invention by referring the attached drawings.

In the following examples, extremely small semiconductor chips used for IC tags and the like are integrated in a semiconductor wafer. In the followings, although FeRAM is formed as the non-volatile memory provided in the semiconductor chip, EEPROM may be formed instead of FeRAM.

(1) First Embodiment

Figure 1E:
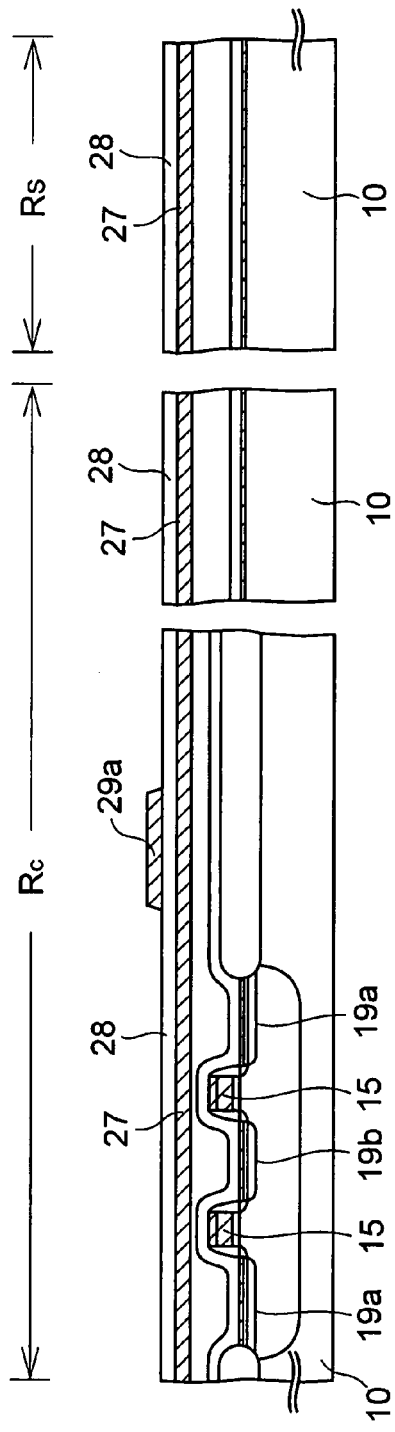
FIGS. 1A to 1Z are cross-sectional views of a semiconductor wafer according to a first embodiment, which is in the process of being manufactured.
Figure 1F:
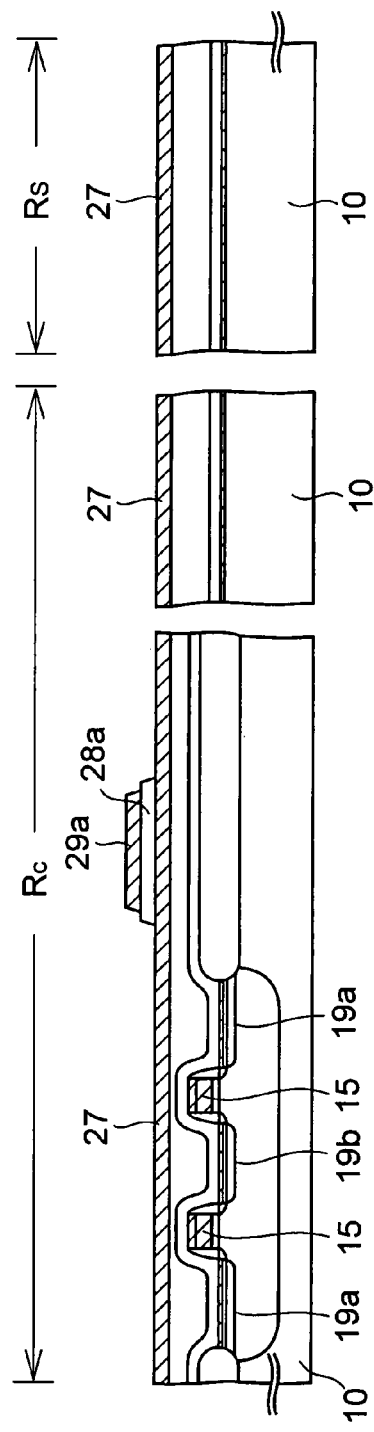
Figure 1G:
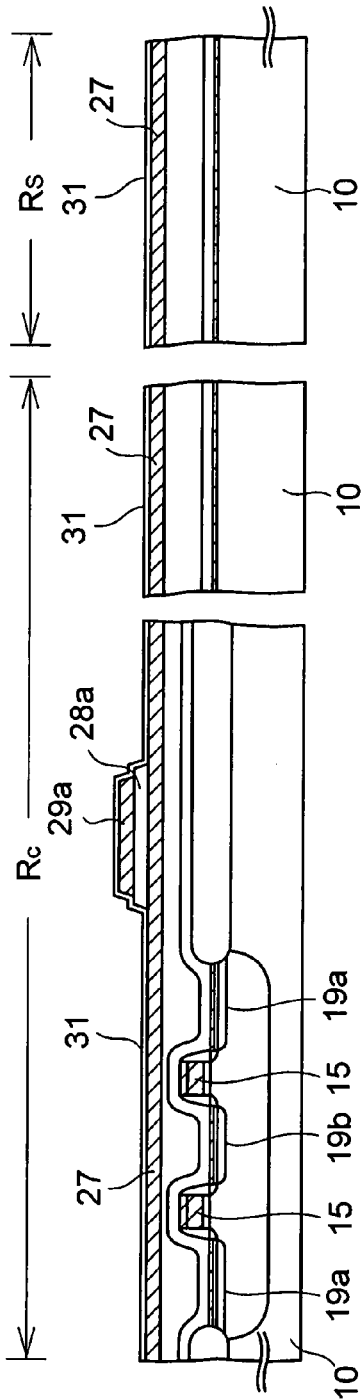
Figure 1H:
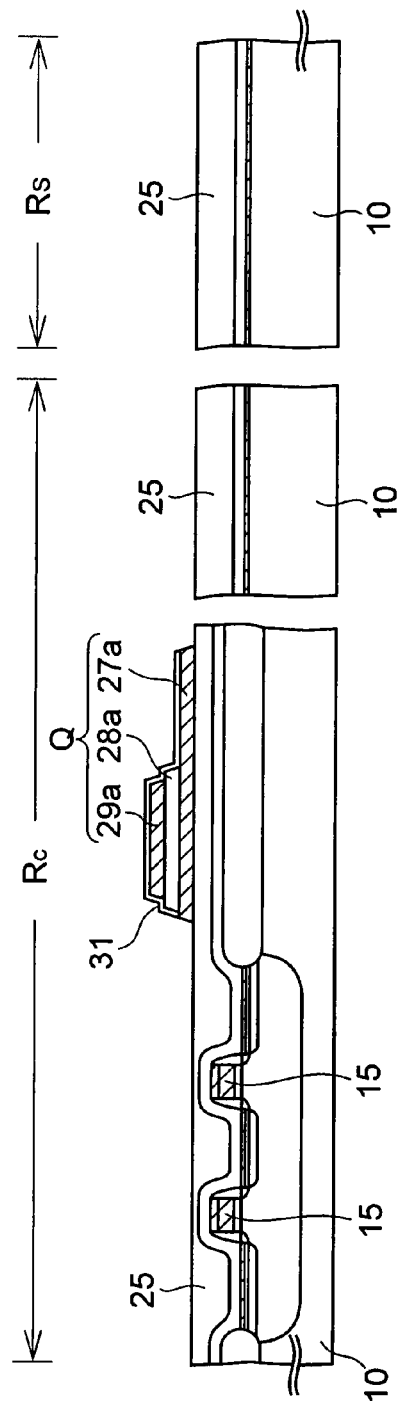
Figure 1N:
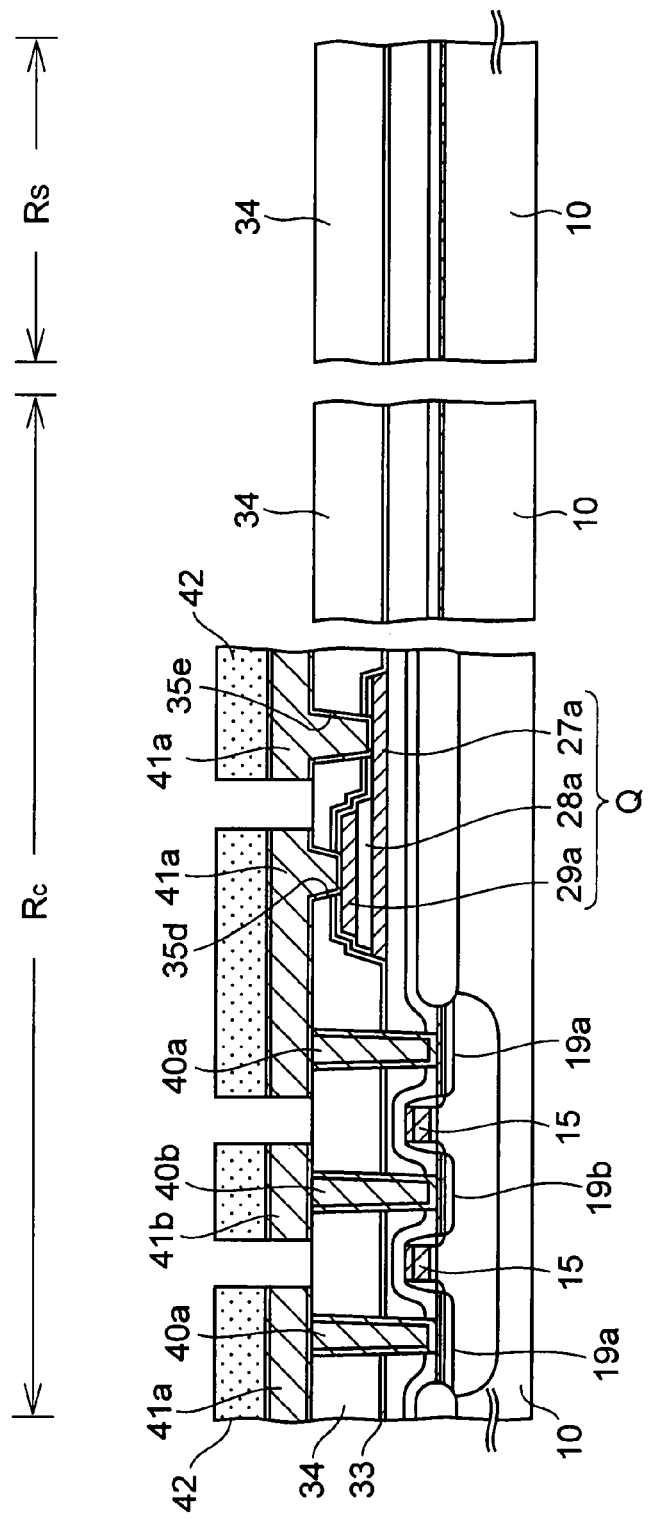
Figure 1P:
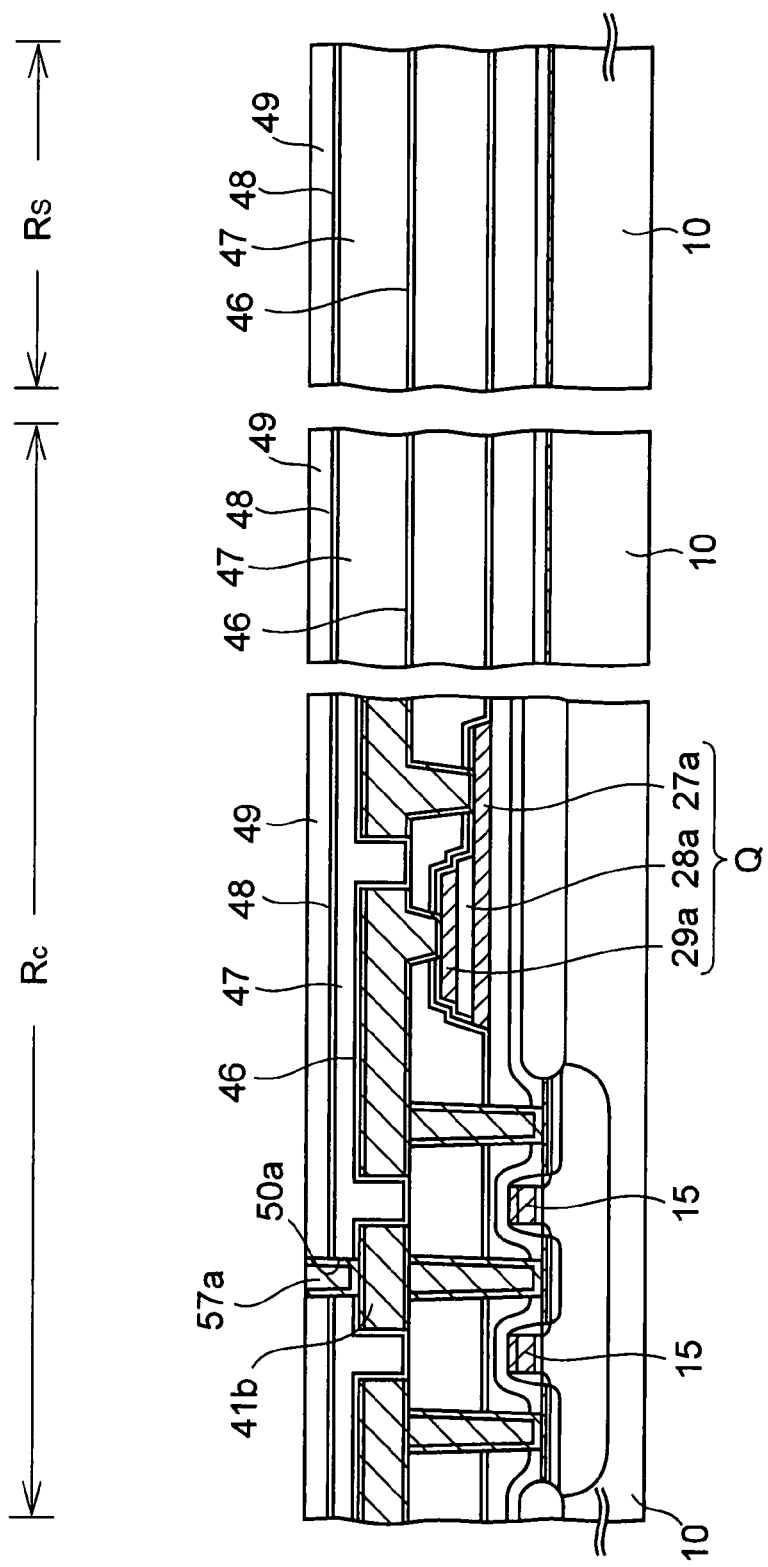
Figure 1Q:
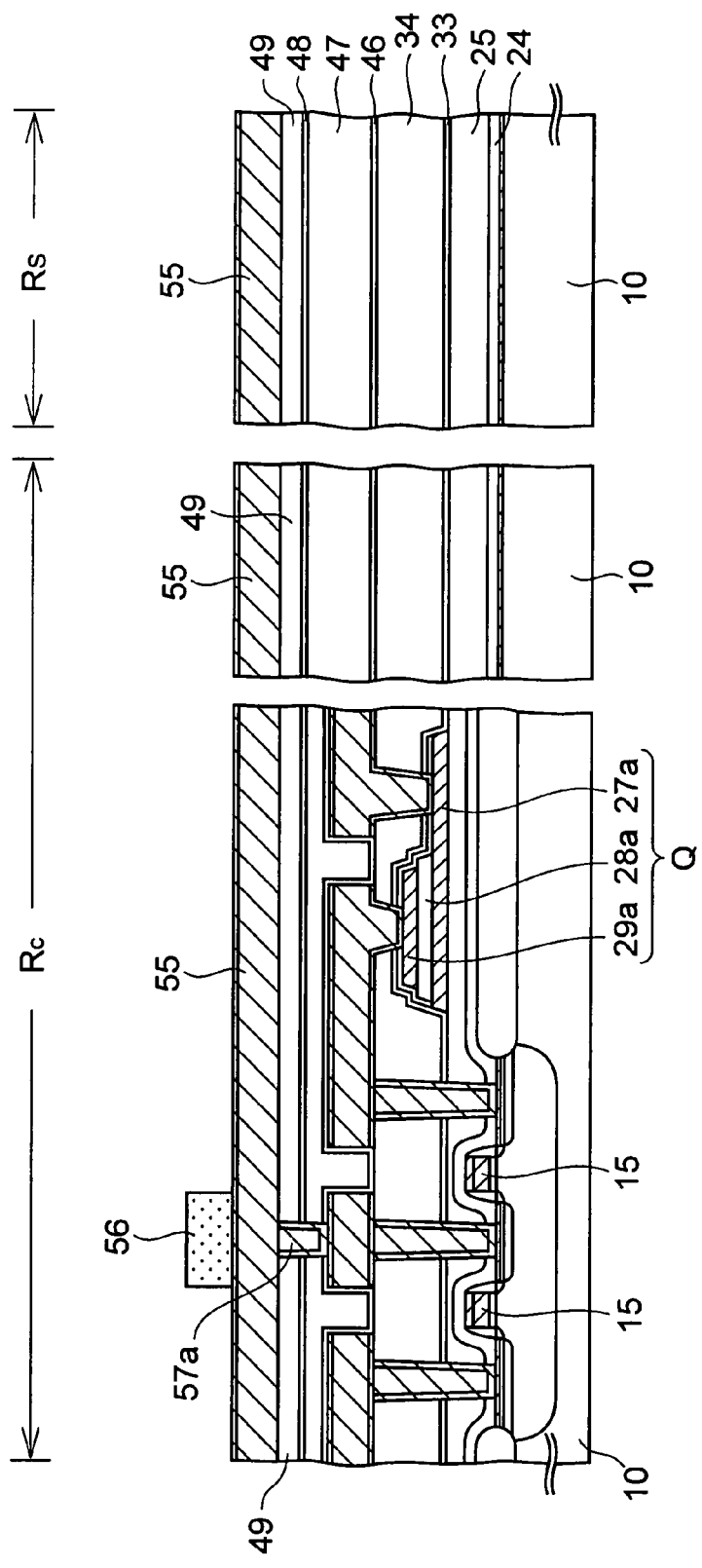
Figure 1R:
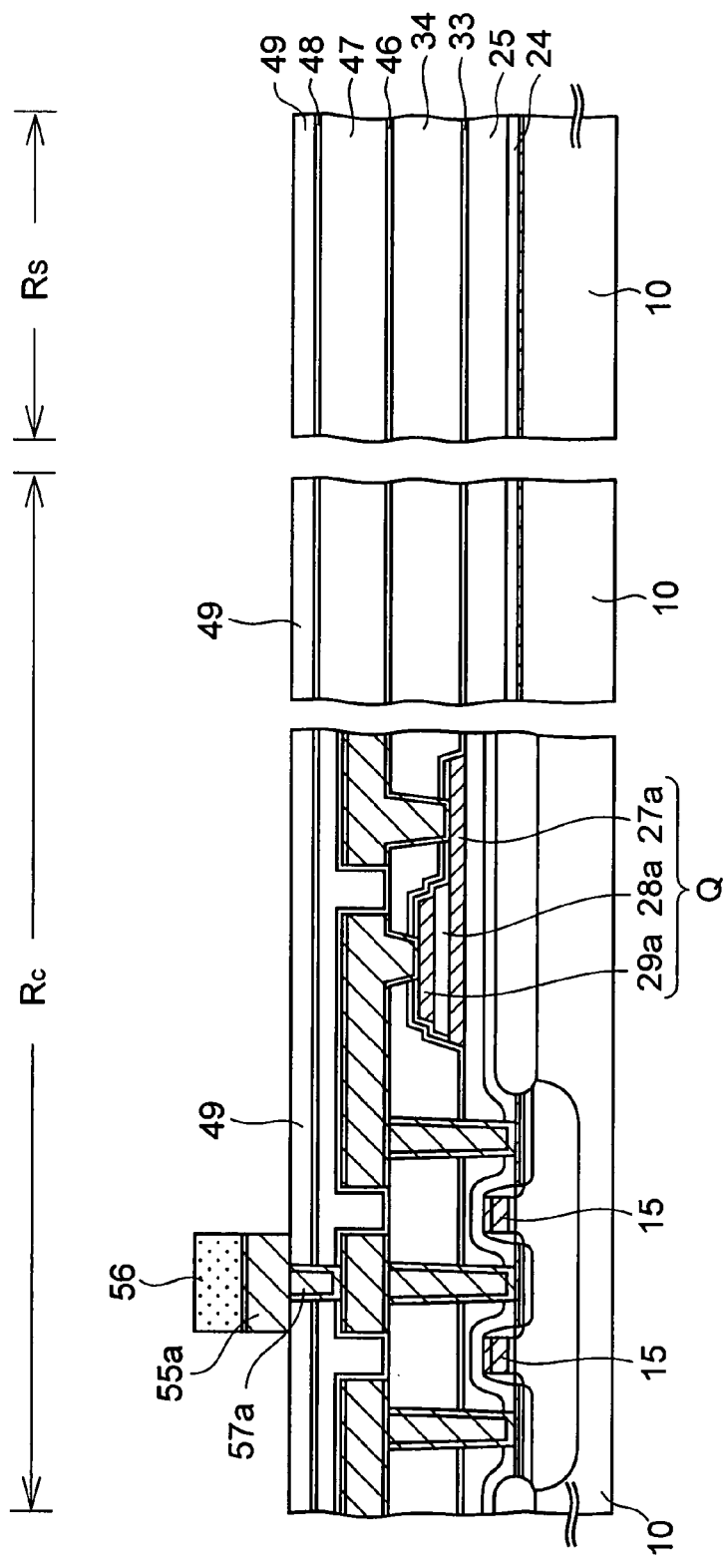
Figure 1S:
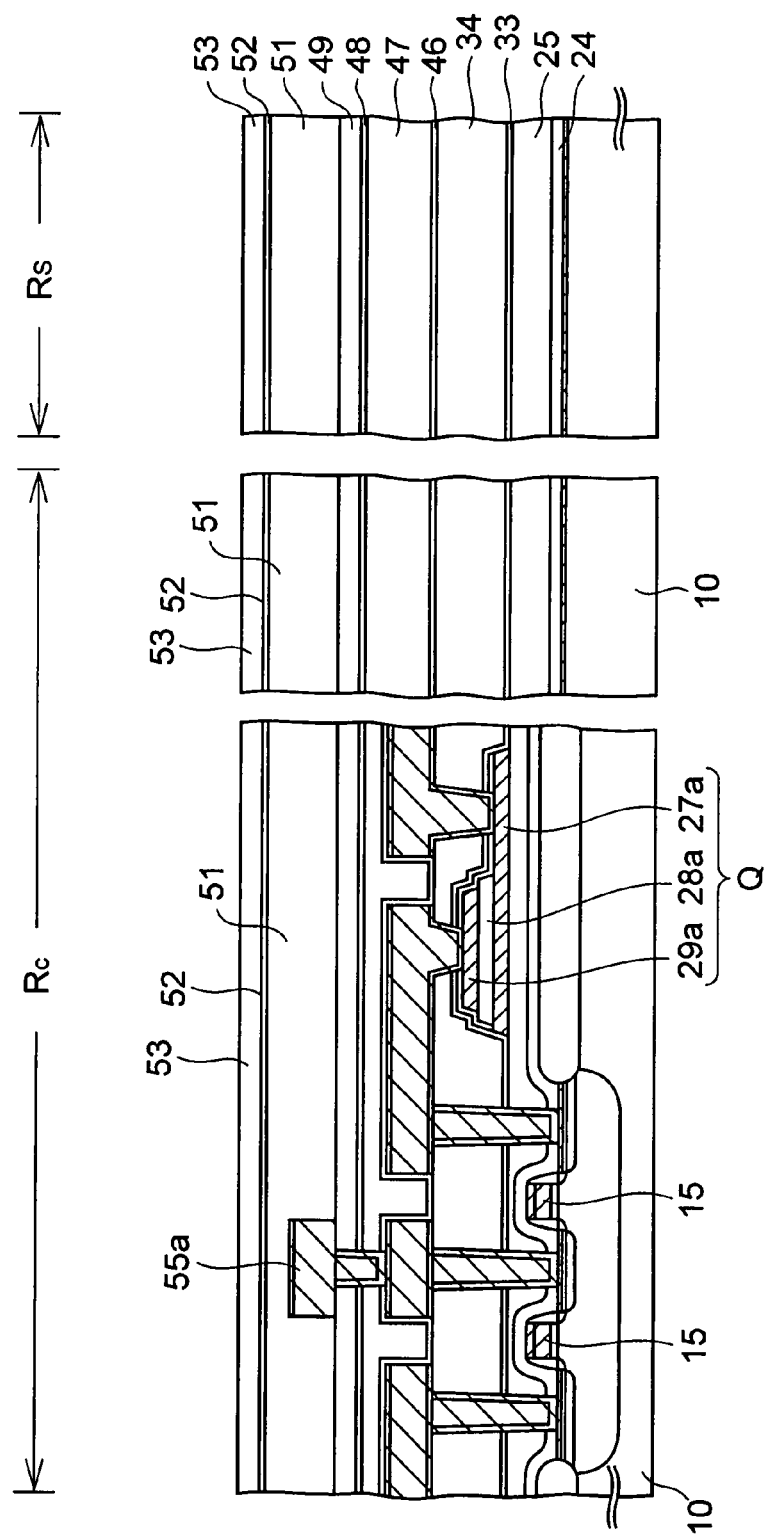
Figure 1T:
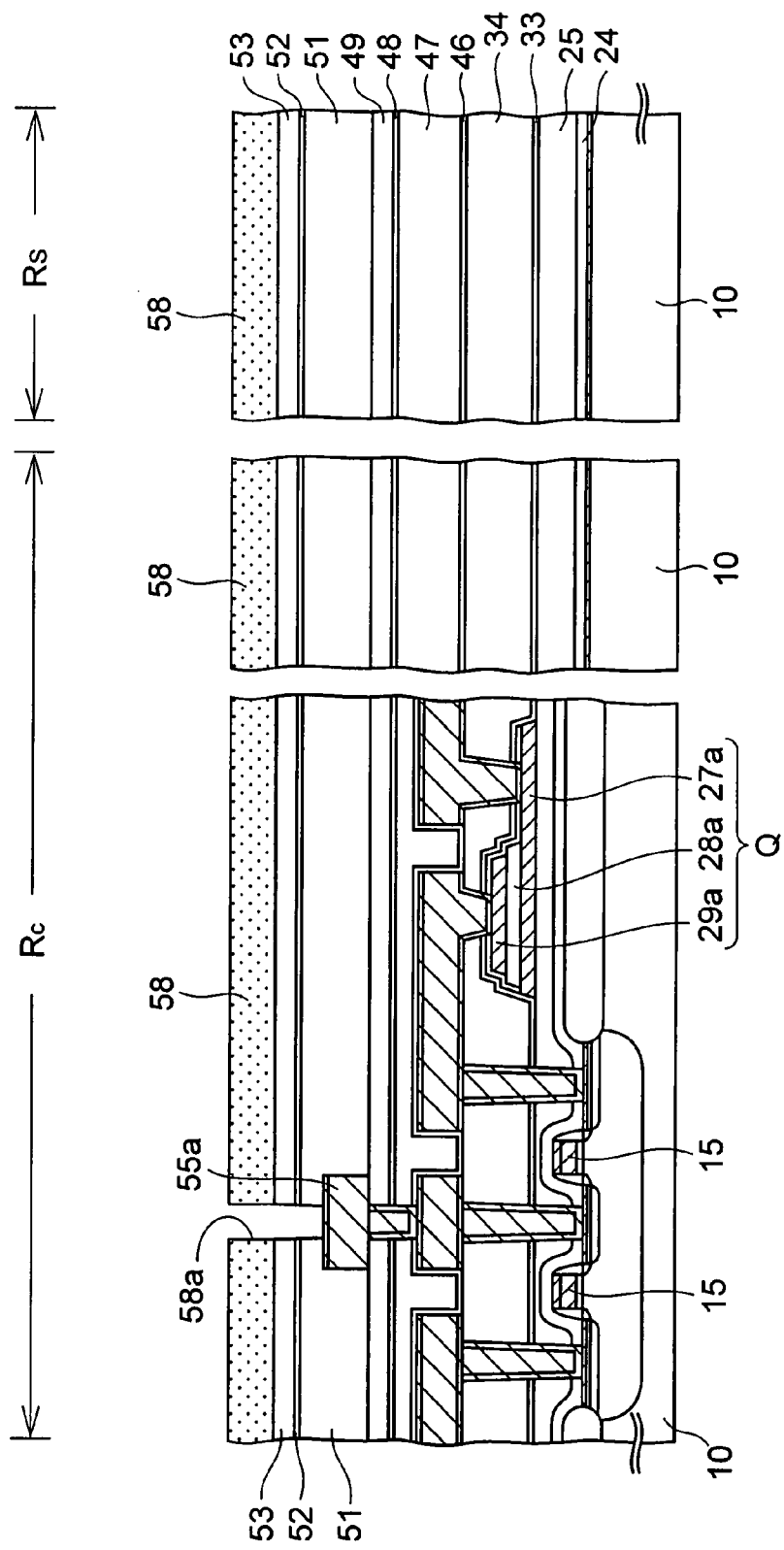
Figure 1V:
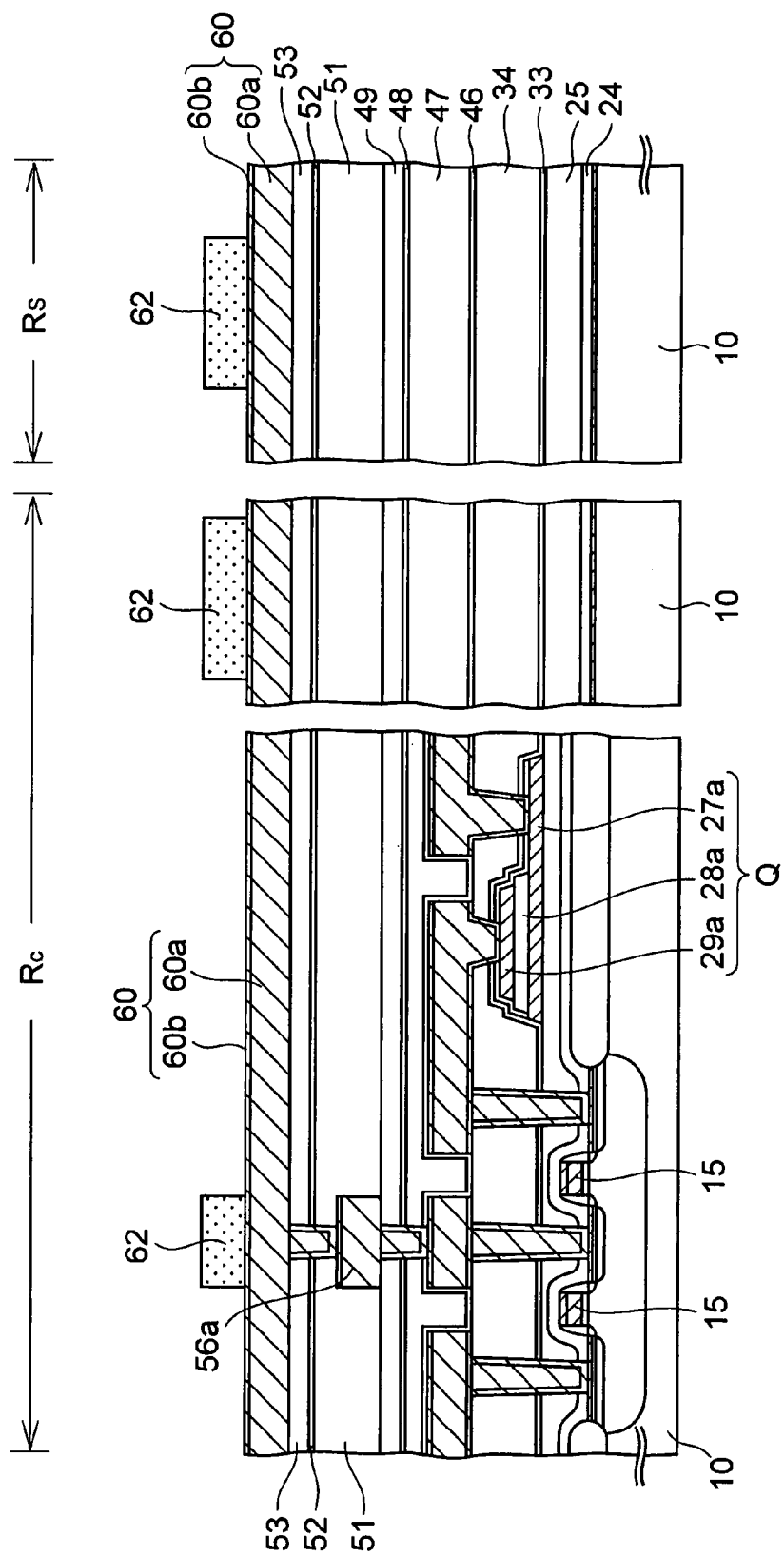
Figure 1W:
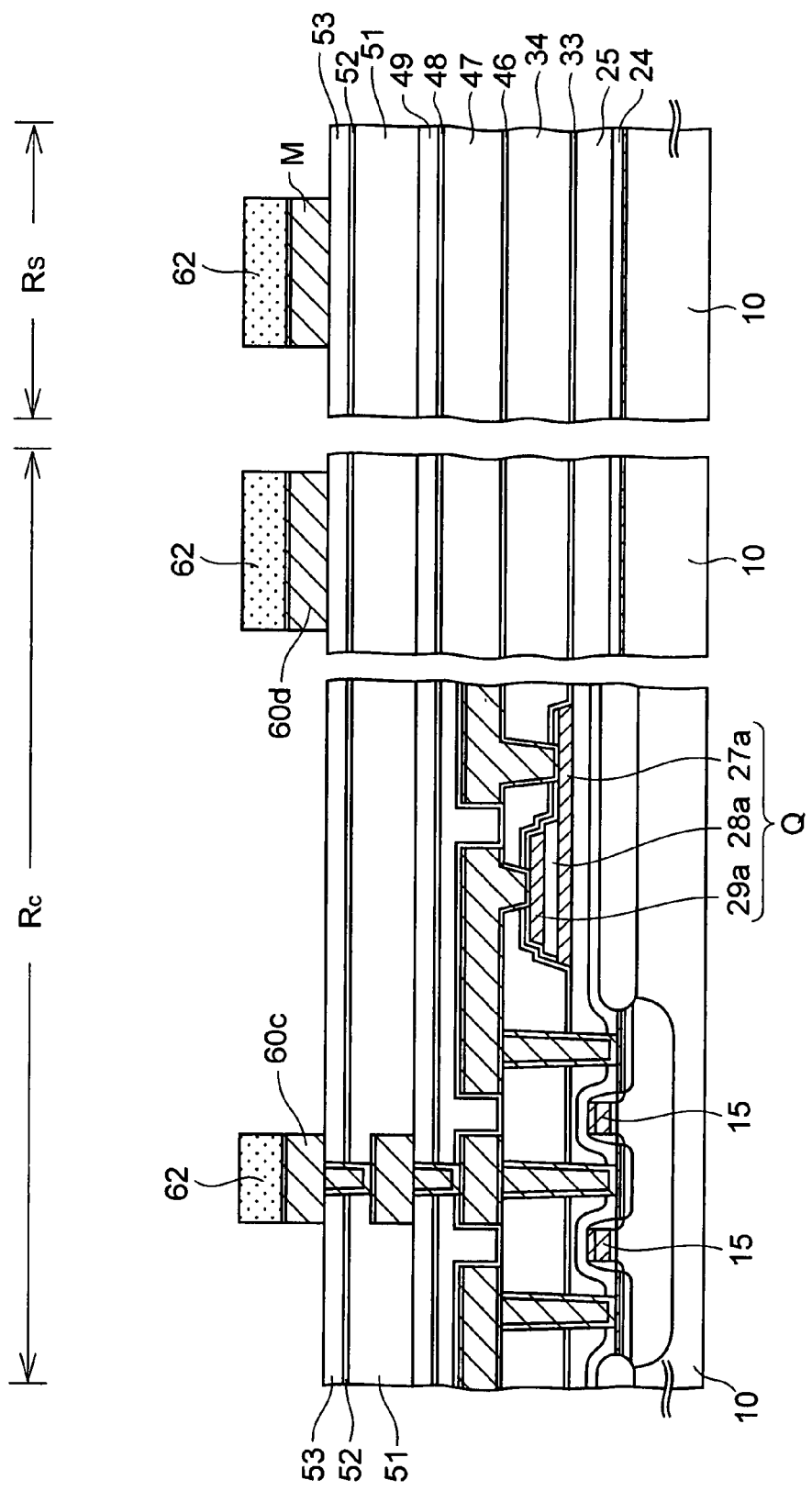
Figure 1X:
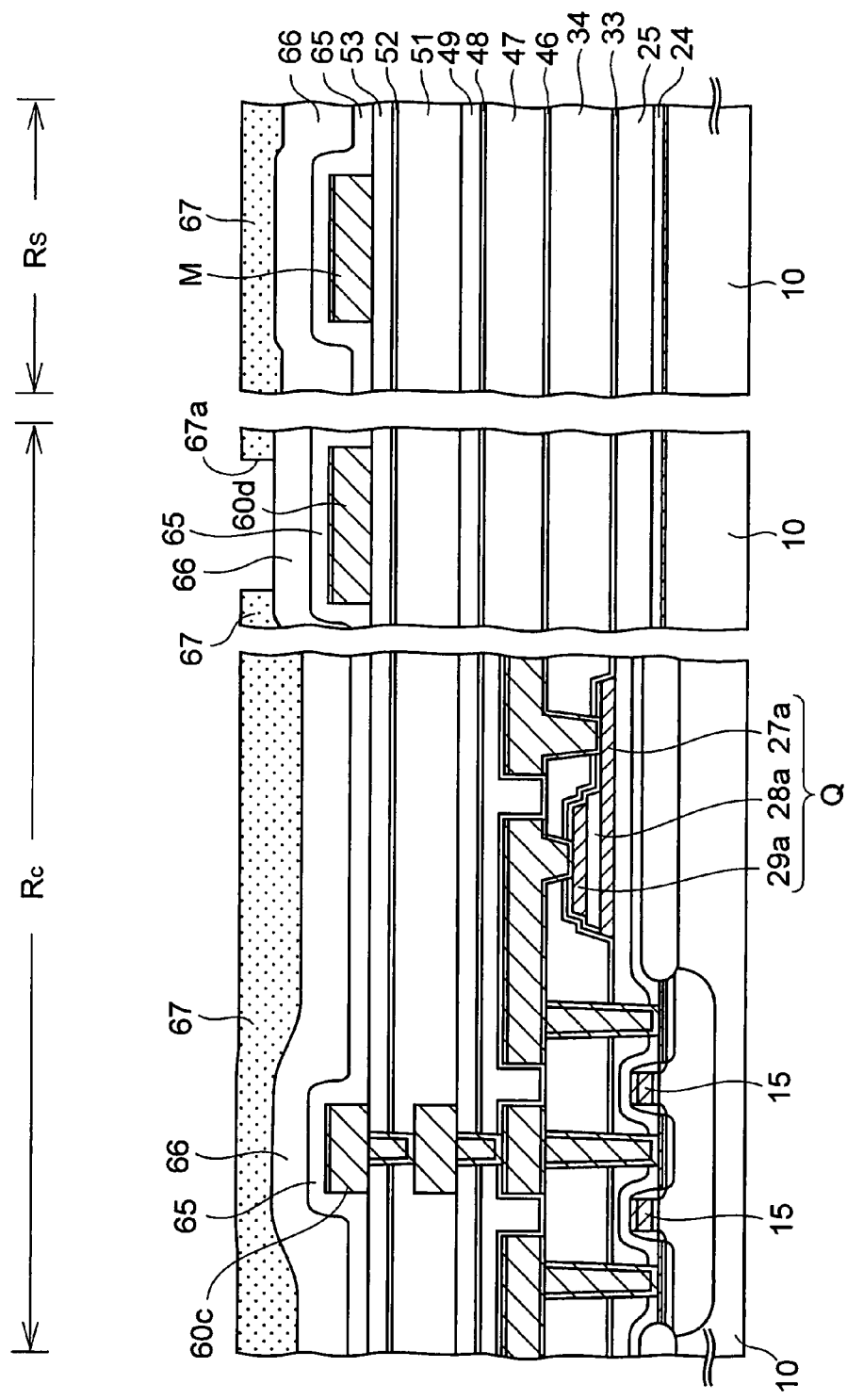
Figure 1Y:
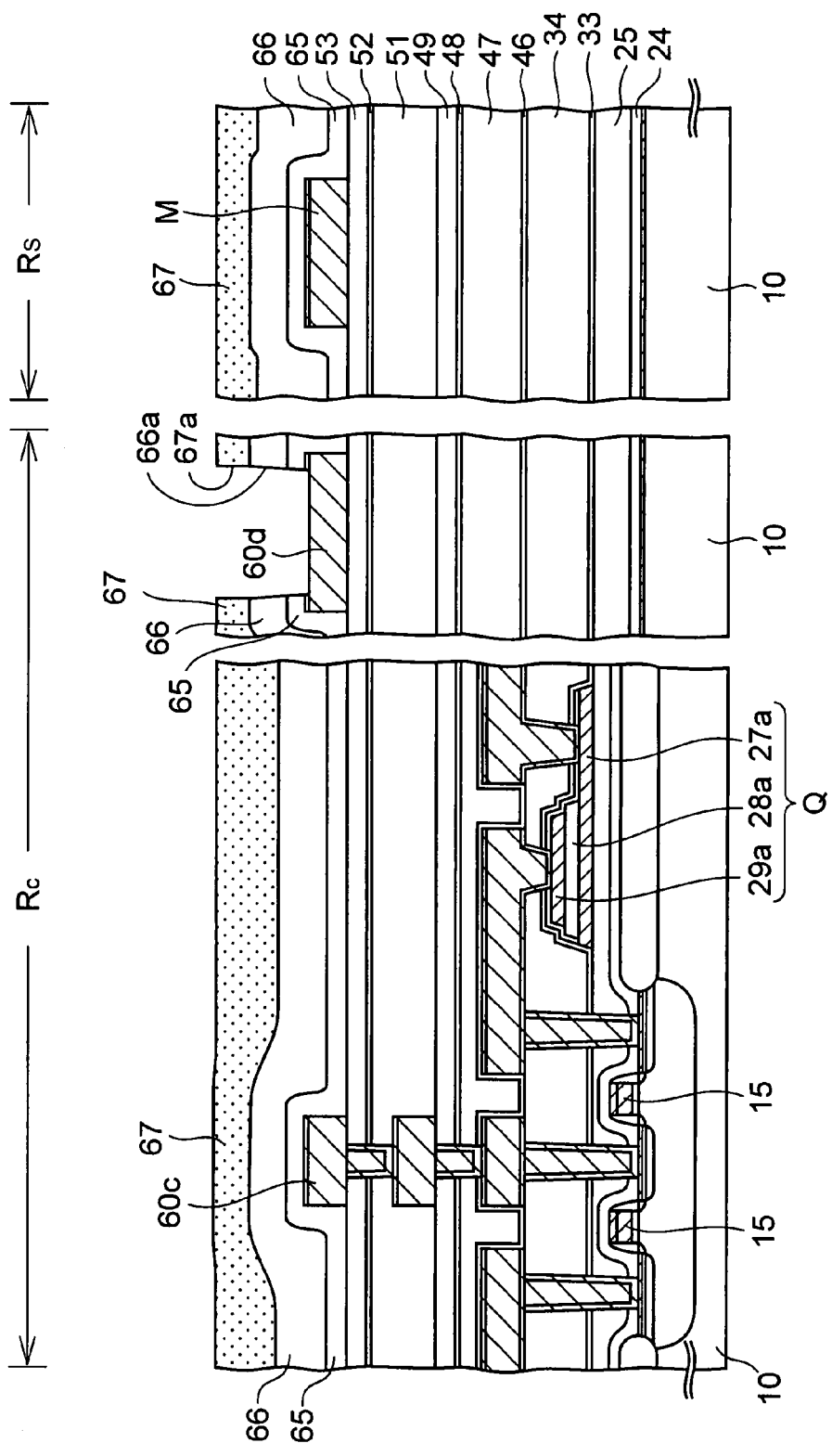
Figure 1Z:
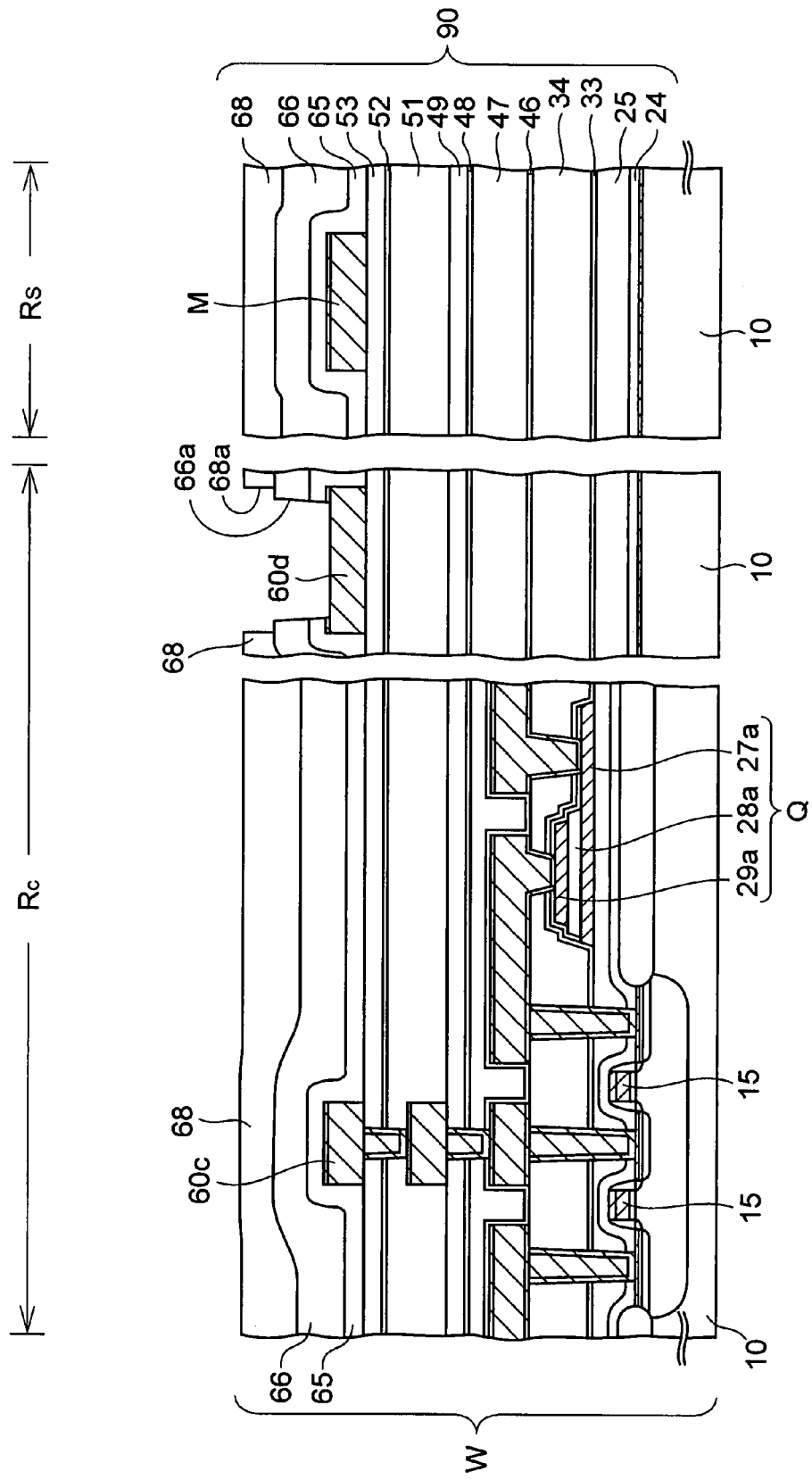

FIGS. 1A to 1Z are cross-sectional views of a semiconductor wafer according to the present embodiment, which are in the process of being manufactured.

First, descriptions will be provided for steps until obtaining a cross-sectional structure shown in FIG. 1A.

Firstly, the surface of a silicon (semiconductor) substrate of n type or p type is thermally oxidized. Thereby, a device isolation insulating film 11 is formed, and an active region for transistors is defined by this device isolation insulating film 11. Such a device isolation structure is called as LOCOS (Local Oxidation of Silicon). Instead of LOCOS, however, STI (Shallow Trench Isolation) may be adopted.

In addition, the silicon substrate 10 is, for example, a silicon wafer with a diameter of 8 inches. The silicon substrate 10 includes chip regions $R_c$ and scribe regions $R_s$, as shown in FIG. 1A. The chip region $R_c$ is defined as a region from which a semiconductor chip is diced out in the silicon substrate. On the other hand, scribe region $R_s$ is defined as a region which exists between neighboring chip regions $R_c$, and through which a dicing saw passes in a step of dicing out semiconductor chips.

Subsequently, p type impurity, for example, boron is introduced into the active region of the silicon substrate 10, and thus, a p well 12 is formed. Thereafter, the active region is thermally oxidized. Thereby, a thermal oxidation film which will serves as a gate insulating film 14 is formed with a thickness of approximately 6 nm to 7 nm.

Subsequently, an amorphous silicon film of about 50 nm thickness and a tungsten silicide film of about 150 nm thickness are sequentially formed on the entire upper surface of the silicon substrate 10. It should be noted that, instead of the amorphous silicon film, a polysilicon film may be formed. After that, these films are patterned by photolithography, so that gate electrodes 15 are formed on the silicon substrate 10.

Two gate electrodes 15 are formed in parallel with each other on the p well 12. The two gate electrodes 15 constitutea a part of a word line.

Subsequently, phosphorus as an n impurity is introduced into the silicon substrate 10 beside the gate electrodes 15 by ion implantation using the gate electrodes 15 as masks. Thus, first and second source/drain extensions 17a and 17b are formed.

Thereafter, an insulating film is formed on the entire upper surface of the silicon substrate 10, and this insulating film is etched back. Thus, the insulating film is left as insulating spacers 18 at the sides of the gate electrodes 15. As the insulating film, a silicon oxide film is formed by CVD (Chemical Vapor Deposition) method, for example.

Subsequently, ions of an n impurity such as arsenic are again implanted into the silicon substrate 10 by using the insulating spacers 18 and the gate electrodes 15 as masks. Thereby, first source/drain regions 19a as well as a second source/drain region 19b are formed in the silicon substrate 10 beside the gate electrodes 15.

Thereafter, a refractory metal film such as a cobalt film, is formed on the entire upper surface of the silicon substrate 10 by sputtering. After that, this refractory metal film is heated and caused to react with the silicon. Thereby, a refractory silicide layer 22 such as a cobalt silicide layer is formed on the silicon substrate 10 of the first and second first source/drain regions 19a and 19b. Thus, the resistances of the first and second first source/drain regions 19a and 19b are lowered. It should be noted that the refractory metal silicide layer 22 is also formed on the surface layer of the silicon substrate 10 in the scribe region $R_s$.

Thereafter, unreacted refractory metal layer on the device isolation insulating film 11 and the like is removed by wet etching.

Through the foregoing steps, first and second MOS transistors $TR_1$ and $TR_2$, which are constructed from the gate insulating film 14, the gate electrode 15, and the first and second source/drain regions 19a and 19b and the like, are formed in the active region of the silicon substrate 10.

Subsequently, as shown in FIG. 1B, a silicon nitride (SiN) film is formed with a thickness of approximately 200 nm on the entire upper surface of the silicon substrate 10 by plasma CVD as a cover insulating film 24. Noted that, instead of the silicon nitride film, a silicon oxynitride (SiN) film may be formed as the cover insulating film 24.

Thereafter, as shown in FIG. 1C, a silicon oxide ($SiO_2$) film is formed on the cover insulating film 24 by plasma CVD using TEOS (Tetra Ethoxy Silane) gas with a thickness of about 600 nm as an underlying insulating film 25. After that, the underlying insulating film 25 is polished with CMP (Chemical Mechanical Polishing) method by a thickness of approximately 200 nm. Thus, the upper surface of the underlying insulating film 25 is planarized.

Next, descriptions will be provided for steps until obtaining a cross-sectional structure shown in FIG. 1D.

First, a platinum film as a lower-electrode conductive film 27 is formed on the underlying insulating film 25 by sputtering. This lower-electrode conductive film 27 will be made into a capacitor lower electrode by patterning later, and its thickness is about 155 nm.

Thereafter, a PZT (Lead Zirconate Titanate: $PbZrTiO_3$) film is formed on the lower-electrode conductive film 27 by sputtering to a thickness of about 150 nm to 200 nm, and this PZT is used as a ferroelectric film 28.

It should be noted that, instead of sputtering, MOCVD (Metal Organic CVD) method and a sol-gel method may be used as the method of forming the ferroelectric film 28. In addition, a material of the ferroelectric film 28 is not limited to PZT. The ferroelectric film 28 may be made of any one of a Bi layer-structured chemical compound, PLZT ($Pb_{1-x}La_xZr_{1-y}Ti_yO_3$) and any other metal oxide ferroelectric. Examples of the Bi layer-structured chemical compound include $SrBi_2Ta_2O_9$, $SrBi_2(Ta_xNb_{1-x})_2O_9$, and $Bi_4Ti_3O_{12}$. Furthermore, PLZT ($Pb_{1-x}La_xZr_{1-y}Ti_yO_3$) is obtained by doping lanthanum into PZT.

Here, PZT formed by sputtering is substantially not crystallized immediately after film formation, so that the PZT shows poor ferroelectric properties. To deal with this problem, crystallization annealing is carried out for the purpose of crystallizing the PZT constituting the ferroelectric film 28, by Rapid Thermal Anneal (RTA) performed in oxygen containing atmosphere with a substrate temperature of about 585° C. Note that when the ferroelectric film 28 is formed by MOCVD method, this crystallization annealing is not necessary.

Thereafter, a first iridium oxide ($IrO_2$) film is formed on the ferroelectric film 28 by sputtering. The first iridium oxide film is approximately 50 nm in thickness. Subsequently, RTA is applied to the first iridium oxide film. Although the conditions for the RTA are not particularly limited, the RTA is carried out for 20 seconds with a substrate temperature of 725° C. in an oxygen-containing atmosphere in the present embodiment.

After that, a second iridium oxide film is formed on the first iridium oxide film by sputtering. The second iridium oxide film is approximately 200 nm in thickness. A laminated film made from the first and the second iridium oxide films is used as an upper-electrode conductive film 29.

Note that an alumina ($Al_2O_3$) film of thin thickness, for example with a thickness of approximately 20 nm, may be formed on the underlying insulating film 25 by sputtering method before forming the lower-electrode conductive film 27. By forming such an alumina film, the crystalline orientation of platinum constituting the lower-electrode conductive film 27 becomes preferable as compared with the case where the lower-electrode conductive film 27 is formed directly on the underlying insulating film 25. Furthermore, by the action of the crystalline orientation of the lower-electrode conductive film 27, crystalline orientation of the PZT constituting the ferroelectric film 28 is aligned, so that the ferroelectric property of the ferroelectric film 28 improves.

Subsequently, as shown in FIG. 1E, an upper electrode 29a is formed by patterning the upper-electrode conductive film 29 by photolithography and by etching. Thereafter, for the purpose of recovering the ferroelectric film 28 from damage caused by the patterning, recovery annealing is applied to the ferroelectric film 28 in a vertical furnace. This recovery annealing is carried out in an oxygen-containing atmosphere. Conditions for the recovery annealing are a substrate temperature of 650° C., and an annealing time of 60 minutes.

Subsequently, as shown in FIG. 1F, the ferroelectric film 28 is patterned by photolithography and by etching, so that a capacitor dielectric film 28a made of a ferroelectric material, such a PZT, is formed. Damage of the capacitor dielectric film received in this patterning is recovered by a recovery annealing. This recovery annealing is carried out by use of a vertical furnace in an oxygen containing atmosphere in the same manner as in the above. The conditions for this recovery annealing are a substrate temperature of 350° C., and a annealing time of 60 minutes.

Next, as shown in FIG. 1G, a first alumina film 31 is formed on the entire upper surface of the silicon film 10 by sputtering to a thickness of about 50 nm in order to protect the capacitor dielectric film 28a from reducing substances such hydrogen, moisture and the like. Then, for the purpose of recovering the capacitor dielectric film 28a from damage caused by the sputtering, recovery annealing is carried out in an oxygen containing atmosphere by heating the substrate at a temperature of 550° C. for approximately 60 minutes. This recovery annealing is carries out, for example, in a vertical furnace.

Next, as shown in FIG. 1H, the lower-electrode conductive film 27 and the first alumina film 31 are patterned by photolithography and by etching. By this patterning, the lower-electrode conductive film 27 under the capacitor dielectric film 28a is made into lower electrode 27a, and the first alumina film 31 is left to cover the lower electrode 27a.

After that, a recovery annealing is applied to the capacitor dielectric film 28a in an oxygen containing atmosphere in a vertical furnace for the purpose of recovering the capacitor dielectric film 28a from damage caused during the process. The conditions for the recovery annealing are a substrate temperature of 550° C., and an annealing time of 60 minutes.

Through the foregoing steps, a capacitor Q is formed in the chip region $R_c$ of the silicon substrate 10. The capacitor Q is constructed by stacking the lower electrode 27a, the capacitor dielectric film 28a and the upper electrode 29a in this order.

Subsequently, as shown in FIG. 1I, a second alumina film 33 is formed on the entire upper surface of the silicon substrate 10 to a thickness of about 20 nm by sputtering method in order to protect the capacitor dielectric film 28a. In cooperation with the first alumina film 31, the second alumina film 33 prevents reducing substances such as hydrogen, moisture and the like from reaching the capacitor dielectric film 28a. Thus, the second alumina film 33 functions to prevent deterioration of the ferroelectric properties of the capacitor dielectric film 28 by reduction.

After that, recovery annealing is applied to the capacitor dielectric film 28a in a vertical furnace in an oxygen containing atmosphere. The conditions for the recovery annealing are a substrate temperature of 550° C., and a treatment time of 60 minutes.

Subsequently, as shown in FIG. 1J, a silicon oxide film is formed on the second alumina film 33 to a thickness of about 1500 nm by plasma CVD method using a TEOS gas, and this silicon oxide film is used as a first interlayer insulating film 34. Thereafter, the upper surface of the first interlayer insulating film 34 is polished and planarized by CMP method.

Next, descriptions will be provided for steps until obtaining a cross-sectional structure shown in FIG. 1K.

First, the first interlayer insulating film 44, the second alumina film 33, the underlying insulating film 25 and the cover insulating film 24 are patterned by photolithography and etching. Thus, first and second contact holes 35a and 35b are formed in these films in the chip region $R_c$.

The first and second contact holes 35a and 35b are formed on the first and second source/drain regions 19a and 19b respectively.

Thereafter, a titanium (Ti) film and a titanium nitride (TiN) film, each with the thickness of 20 nm and 50 nm respectively, are formed on the inner surface of the first and second contact holes 35a and 35b, as well as on the upper surface of the first interlayer insulating film 34, and these films are used as a glue film. Next, a tungsten film is formed on the glue film by CVD method using a tungsten hexafluoride gas, so that the first and second contact holes 35a and 35b are completely filled with the tungsten film.

Then, excessive glue film and tungsten film on the first interlayer insulating film 34 are polished and removed by CMP method. Thus, the glue film and the tungsten film are left only in the first and second contact holes 35a and 35b.

The glue film and the tungsten film left in the first and second contact holes 35a and 35b constitute first and second contact plugs 40a and 40b that is electrically connected to the first and second source/drain regions 19a and 19b.

Here, since the first and second contact plugs 40a and 40b are formed mainly of tungsten which is easily oxidized, it is likely that the plugs 40a and 40b is oxidized in an oxygen containing atmosphere to cause contact failure.

To deal with this problem, as shown in FIG. 1L, a silicon oxynitride film is formed on the entire upper surface of the silicon substrate 10 with a thickness of about 100 nm as an anti-oxidizing insulating film 41. This anti-oxidizing insulating film 41 prevents the first and second contact plugs 40a and 40b from oxidizing.

Thereafter, films from the anti-oxidizing insulating film 41 to the first alumina film 31 are patterned by photolithography and by etching. Thus, a first opening 35d is formed in these films on the upper electrode 29a. In addition, a second opening 35e is formed in these films on the lower electrode 27a.

Subsequently, for the purpose of recovering the capacitor dielectric film 28a from damage caused through the foregoing steps, the silicon substrate 10 is placed in a vertical furnace in an oxygen-containing atmosphere, thereby the 6th recovery annealing is applied to the capacitor dielectric film 28a therein. The conditions for the recovery annealing are a substrate temperature of 500° C., and a treatment time of 60 minutes.

Next, as shown in FIG. 1M, a metal laminated film is formed on the upper surface of the first interlayer insulating film 34, and the first and second contact plugs 40a and 40b by sputtering as a first conductive film 41. In the present embodiment, the metal laminated film is formed by stacking a titanium nitride film of about 150 nm, a copper-containing aluminum film of about 550 nm, a titanium film of about 5 nm, and a titanium nitride of about 150 nm in this order. This metal laminated film is also formed in the first and second openings 35d and 35e on the capacitor Q.

Moreover, a photoresist is applied on the upper surface of the first conductive film 41, and the photoresist is exposed and developed. Thus, a first resist pattern 42 is formed.

Subsequently, as shown in FIG. 1N, the first conductive film 41 is etched by using the first resist pattern 42 as a mask. Thus, first-layer metal interconnects 41a and 41b are formed on the first interlayer insulating film 34 in the chip region $R_c$.

The metal interconnects 41a formed on the capacitor Q are electrically connected to the upper and lower electrodes 29a and 27a through the first and second openings 35d and 35e respectively.

On the other hand a first-layer metal interconnect 41b formed over the second source/drain region 19b, along with the second contact plug 40b, constitutes a part of a bit line.

Then, after the first resist pattern 42 is removed, the first interlayer insulating film 34 is annealed by use of, for example, a vertical furnace with a nitrogen atmosphere. The conditions for the annealing are a substrate temperature of 350° C., a N₂ flow rate of 20 liters per minute, and a treatment time of 30 minutes. Thus, the first interlayer insulating film 34 is dehydrated.

Figure 10:
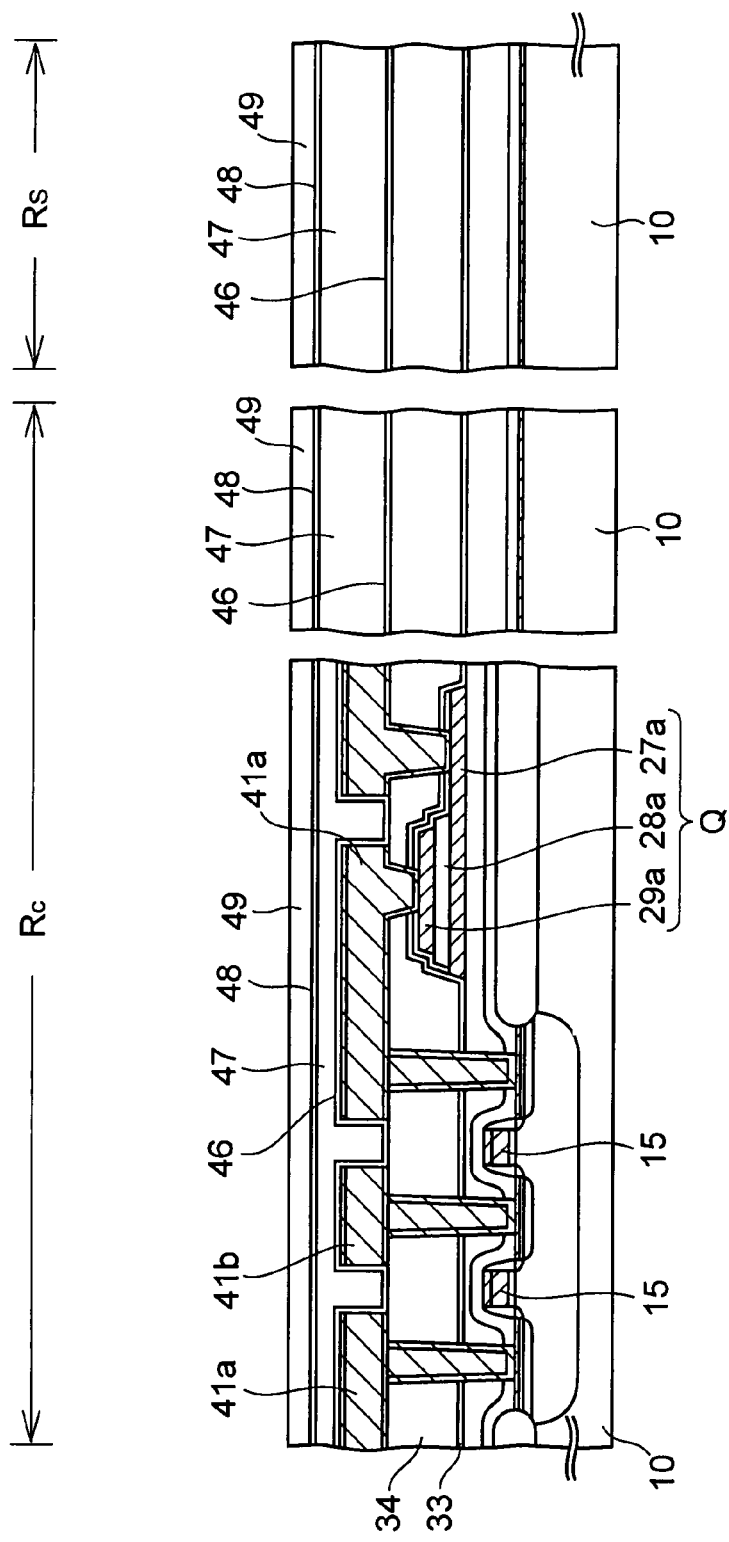
FIG. 10 is a cross-sectional view of a semiconductor wafer according to a fifth example of the second embodiment.

Next, descriptions will be provided for steps until a cross-sectional structure shown in FIG. 10 is obtained.

First, an alumina film as a first capacitor protection insulating film 46 is formed on the entire upper surface of the silicon substrate 10 by sputtering.

The first capacitor protection insulating film 46 has a function of protecting the capacitor dielectric film 28*a* by blocking reducing substances such as hydrogen, moisture and the like from reaching the capacitor dielectric film 28*a*. In addition to the alumina film, a titanium oxide ($TiO_2$) film is also an insulating film having such a function.

Thereafter, a silicon oxide film is formed on the first capacitor protection insulating film 46 by plasma CVD using a TEOS gas as a second interlayer insulating film 47. Thereafter, the second interlayer insulating film 47 is polished and planarized by CMP. The thickness of the planarized second interlayer insulating film 47 is approximately 1000 nm on the first-layer metal interconnects 41*a* and 41*b*.

After that, the second interlayer insulating film 47 is dehydrated by $N_2O$ plasma treatment. Subsequently, an alumina film is formed on the second interlayer insulating film 47 with a thickness of about 50 nm by sputtering for the purpose of preventing reducing substances such as hydrogen and moisture, which are included in the external atmosphere, from reaching the capacitor dielectric 28*a*. The alumina film thus formed is used as a second capacitor protection insulating film 48.

The second capacitor protection insulating film 48 is not limited to the alumina film. As in the case of the first capacitor protection insulating film 46, a titanium oxide film may be formed as the second capacity protection insulating film 48.

It should be noted that a silicon oxide film with a thickness of approximately 100 nm may be formed on the second interlayer insulating film 47 by CVD using a TEOS gas before forming the second capacitor protection insulating film 48, and that the silicon oxide film thus formed may be dehydrated by $N_2O$ plasma treatment.

Subsequently, a silicon oxide film is formed on the second capacitor protection insulating film 48 by plasma CVD using a TEOS gas as a first cap insulating film 49. The thickness of this first cap insulating film 49 is approximately 100 nm, for example.

Thereafter, the first cap insulating film 49 is dehydrated by $N_2O$ plasma treatment.

Next, descriptions will be provided for the steps until a cross-sectional structure shown in FIG. 1P is obtained.

First, the insulating films 46 to 49 are patterned by photolithography and dry etching. Thus, a first hole 50*a* is formed on the first-layer metal interconnect 41*b* in the chip region $R_c$.

Subsequently, a titanium nitride film is formed on the second interlayer insulating film 47 and on the inner surface of the first hole 50*a* by sputtering as a glue film. The titanium nitride film is approximately 150 nm in thickness.

Thereafter, a tungsten film is formed on the glue film by plasma CVD using a tungsten hexafluoride gas, so that the first hole 50*a* is completely filled with the tungsten film.

Next, excessive glue film and tungsten film on the first cap insulating film 49 are polished and removed by CMP. Thus, the glue film and the tungsten film are left only in the first hole 50*a* alone. It should be noted that, instead of CMP, an etching-back method may be adopted for this step.

The glue film and the tungsten film left in the first hole 50*a* in this manner is used as a first conductive plug 57*a* which is electrically connected to the first-layer metal interconnect 41*b*.

Subsequently, as shown in FIG. 1Q, a metal laminated film is formed on the first cap insulating film 49 and on the first conductive plug 57*a* by sputtering as a second conductive film 55. The metal laminated film is configured, for example, of a copper-containing aluminum film of about 550 nm thickness, a titanium film of about 5 nm thickness, and a titanium nitride film of about 150 nm thickness, which are formed in this order.

Thereafter, a photoresist is applied on the second conductive film 55. Then, this photoresist is exposed and developed. Thus, a second resist pattern 56 is formed.

Subsequently, as shown in FIG. 1R, the second conductive film 55 is dry-etched by using the second resist pattern 56 as a mask. Thus, a second-layer metal interconnect 55*a* is formed.

Thereafter, the second resist pattern 56 is removed.

Subsequently, as shown in FIG. 1S, a silicon oxide film is formed on the first cap insulating film 49 and on the second-layer metal interconnect 55*a* by plasma CVD using a TEOS gas. The silicon oxide film is approximately 2200 nm in thickness, and is used as a third interlayer insulating film 51.

Then, the upper surface of the third interlayer insulating film 51 is polished and planarized by CMP. After that, the third interlayer insulating film 51 is dehydrated by $N_2O$ plasma treatment. The $N_2O$ plasma treatment is carried out in a CVD system. The conditions for the $N_2O$ plasma treatment are a substrate temperature of 350° C., and a treatment time of four minutes, for example.

Next, an alumina film is formed on the third interlayer insulating film 51 by sputtering as a third capacitor protection insulating film 52. The third capacitor protection insulating film 52 is formed for the purpose of protecting the capacitor dielectric film 28*a* from reducing substances, and is approximately 50 nm in thickness. It should be noted that, instead of the alumina film, a titanium oxide film may be formed as the third capacitor protection insulating film 52.

Moreover, a silicon oxide film with a thickness of approximately 100 nm may be formed on the third interlayer insulating film 51 by CVD using a TEOS gas before forming the third capacitor protection insulating film 52, and this silicon oxide film may be dehydrated by $N_2O$ plasma treatment.

Thereafter, a silicon oxide film is formed on the third capacitor protection insulating film 52 by plasma CVD using a TEOS gas. The silicon oxide film is approximately 100 nm in thickness, and is used as a second cap insulating film 53.

After that, $N_2O$ plasma treatment is applied to the second cap insulating film 53 in a CVD system. The conditions for the $N_2O$ plasma treatment are a substrate temperature of 350° C., and a treatment time of two minutes. Thus, the second cap insulating film 53 is dehydrated.

Next, as shown in FIG. 1T, a photoresist is applied on the second cap insulating film 53. Subsequently, the photoresist is exposed and developed to form a third resist pattern 58 having a window 58*a* over the second-layer metal interconnect 55*a*.

Next, the insulating films 51 to 53 are dry-etched by use of the window 58*a*, so that a second hole 54*a* is formed on the second-layer metal interconnect 55*a*.

After completing this etching, the third resist pattern 58 is removed.

Next, descriptions will be provided for the steps until a cross-sectional structure shown in FIG. 1U is obtained.

First, a titanium nitride film is formed on the second cap insulating film 53 and on the inner surface of the second hole 54a by sputtering with a thickness of about 50 nm as a glue film. Then, a tungsten film is formed on the glue film by CVD with a thickness sufficient for completely embedding the second hole 54a, for example about 650 nm.

Thereafter, excessive glue film and tungsten film on the second cap insulating film 53 are polished by CMP, so that these films are left only in the second hole 54a as a second conductive plug 56a.

Subsequently, as shown in FIG. 1V, an aluminum film 60a is formed on the second conductive plug 56a and on the second cap insulating film 53 by sputtering to a thickness of about 500. The aluminum film 60a also contains copper.

After that, a titanium nitride film 60b with a thickness of approximately 150 nm is formed on the aluminum film 60a by sputtering. This titanium nitride film 60b and the aluminum film 60a constitute a third conductive film 60.

Subsequently, a photoresist is applied on the third conductive film 60. Thereafter, the photoresist is exposed and developed to form a fourth resist pattern 62.

Thereafter, as shown in FIG. 1W, the third conductive film 60 is etched by using the fourth resist pattern 62 as a masks.

By this etching, third-layer metal interconnects 60c and 60d are formed on the second cap insulating film 53 in the chip region $R_c$. In addition, a reference mark M is formed in the scribe region $R_s$.

The third-layer metal interconnect 60d has a function as a testing pad to which the testing needle is connected when an electrical test is carried out at a wafer level in the later step.

On the other hand, the reference mark M is used as an alignment mark during the electrical test.

Thereafter, the fourth resist patterns 62 are removed.

Subsequently, as shown in FIG. 1X, a silicon oxide film is formed on the entire upper surface of the silicon substrate 10 by CVD using a TEOS gas to a thickness of about 100 nm as a first passivation film 65.

Next, $N_2O$ plasma treatment is applied to the first passivation film 65. Thereby, the first passivation film 65 is dehydrated, and the upper surface thereof is nitrided. Thus, moisture is prevented from adhering to the first passivation film 65 again. The $N_2O$ plasma treatment is carried out, for example, at a substrate temperature of 350° C. and for a treatment time of two minutes.

Subsequently, a silicon nitride film is formed on the first passivation film 65 by CVD to a thickness of about 350 nm as a second passivation film 66.

Thereafter, a photoresist is applied to on the second passivation film 66, and the photoresist is exposed and developed. Thus, a fifth resist pattern 67, which has a window 67a above the third-layer metal interconnect 65, is formed.

Subsequently, as shown in FIG. 1Y, the first and second passivation films 65 and 66 are dry-etched by using the fifth resist pattern 67 as a mask. Thereby, a third opening 66a is formed in these films. This dry etching is carried out, for example, by use of a parallel-plate-type plasma etching equipment (not illustrated), and a gas mixture of $CHF_3$, $CF_4$ and $O_2$ is used as an etching gas.

After that, the fifth resist pattern 67 is removed.

Next, descriptions will be provided for the steps until a cross-sectional structure shown in FIG. 1Z is obtained.

First, photosensitive polyimide is applied on the second passivation film 66 and in the third opening 66a, so that a polyimide-coated film is formed with a thickness of approximately of 3 μm. Subsequently, this polyimide-coated film is exposed and developed. Thereafter, the polyimide-coated film is heated to be hardened in a horizontal furnace in a nitrogen atmosphere. Although the hardening condition is not particularly limited, substrate temperature of 310° C., a nitrogen flow rate of 100 liters per minute, and a treatment time of 40 minutes are employed as the condition in the present embodiment.

Thereby, a polyimide protection film 68, which has a fourth opening 68a over the third-layer metal interconnect 60d, is formed.

Through the foregoing steps, a basic structure of the semiconductor wafer W according to the present embodiment is completed.

The semiconductor wafer W is made by forming the stacked films 90 on the silicon substrate 10, and the reference mark M is formed in one layer of the stacked films 90. Note that the stacked films 90 is constructed from the all films formed on the silicon substrate 10.

Figure 2:
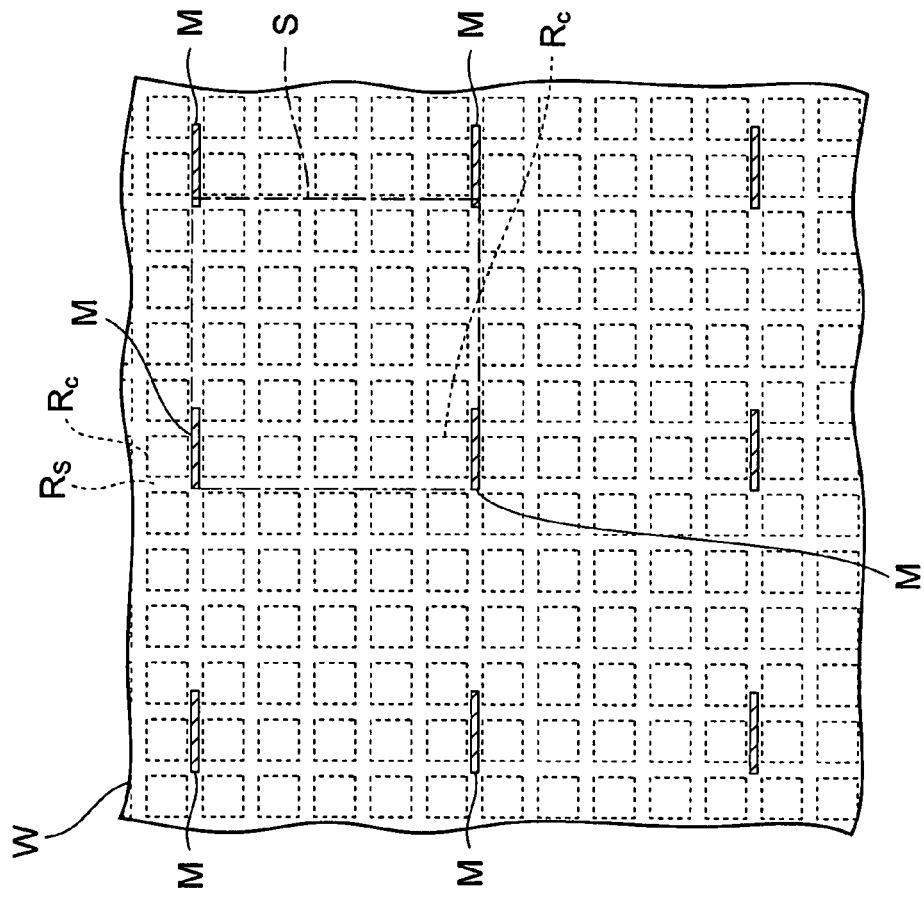
FIG. 2 is an enlarged, plan view of the semiconductor wafer according to the first embodiment.

FIG. 2 is an enlarged plan view of the silicon wafer W.

As described above, since the semiconductor chips for the IC tags are diced out from the semiconductor wafer W, each chip region $R_c$ is a square whose side lengths are as short as approximately 1 mm. Note that the side lengths of the ordinary semiconductor chips are about 1 cm to 1.5 cm, which are about 10 times longer than the present embodiment.

On the other hand, the reference mark M formed in scribe regions $R_s$ is longer than one side of the square chip region $R_c$. In addition, the reference mark M is arranged at least one of the vertices of a virtual rectangle S encompassing a plurality of chip regions $R_c$. The size of the virtual rectangle S is not particularly limited. However, it is preferable that a region which is exposed by one shot of an exposure system used in an exposure step be employed as the virtual rectangle S. Note that the exposed region is the same for all of the films constituting the stacked film 90, and the planer shape of the exposed region is a square.

After completing these steps, testing step for checking whether the chips formed in the chip regions $R_c$ operate normally is performed.

Figure 3:
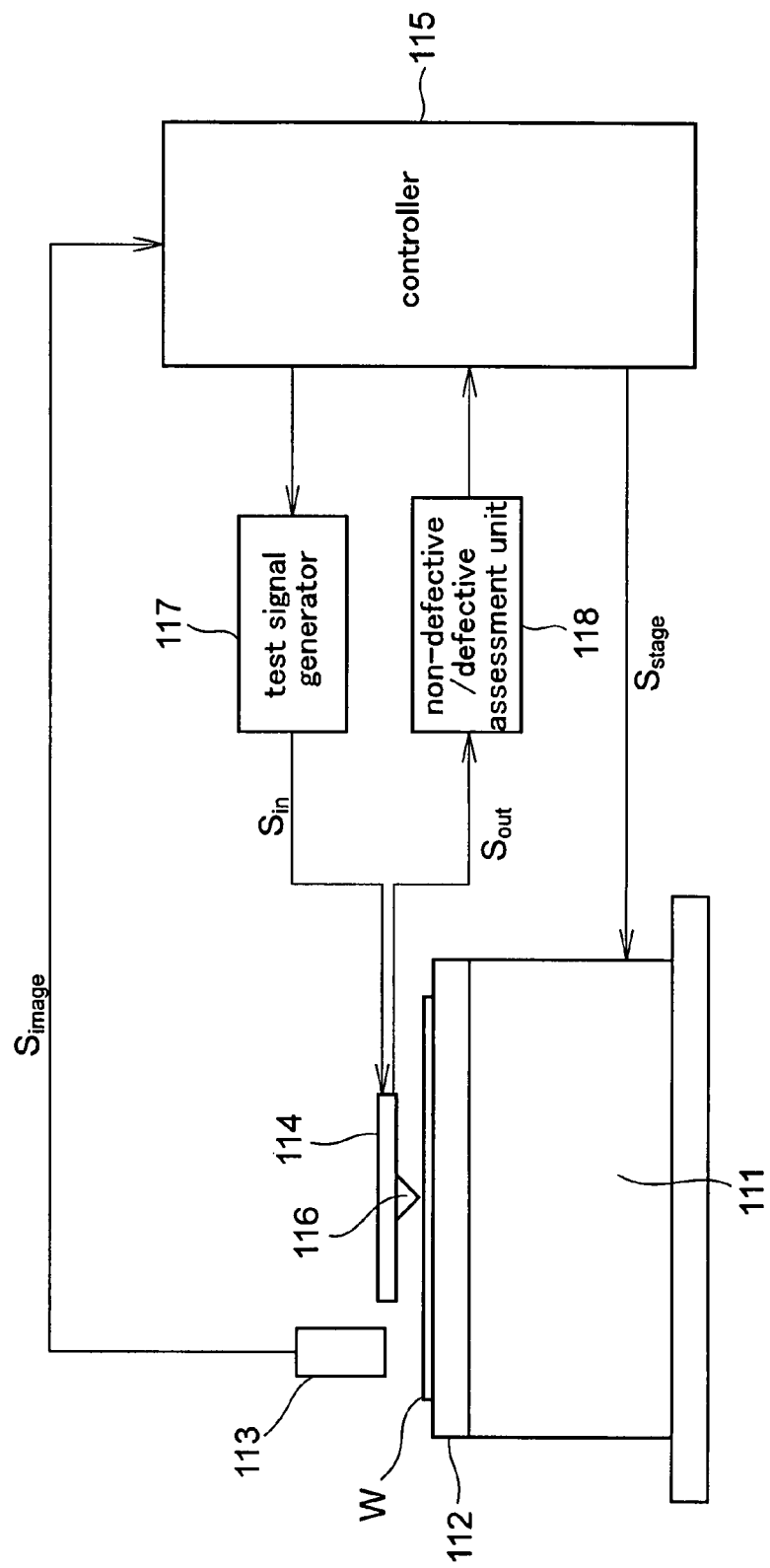
FIG. 3 is a diagram of a configuration of a testing equipment used for the first embodiment.
Figure 4:
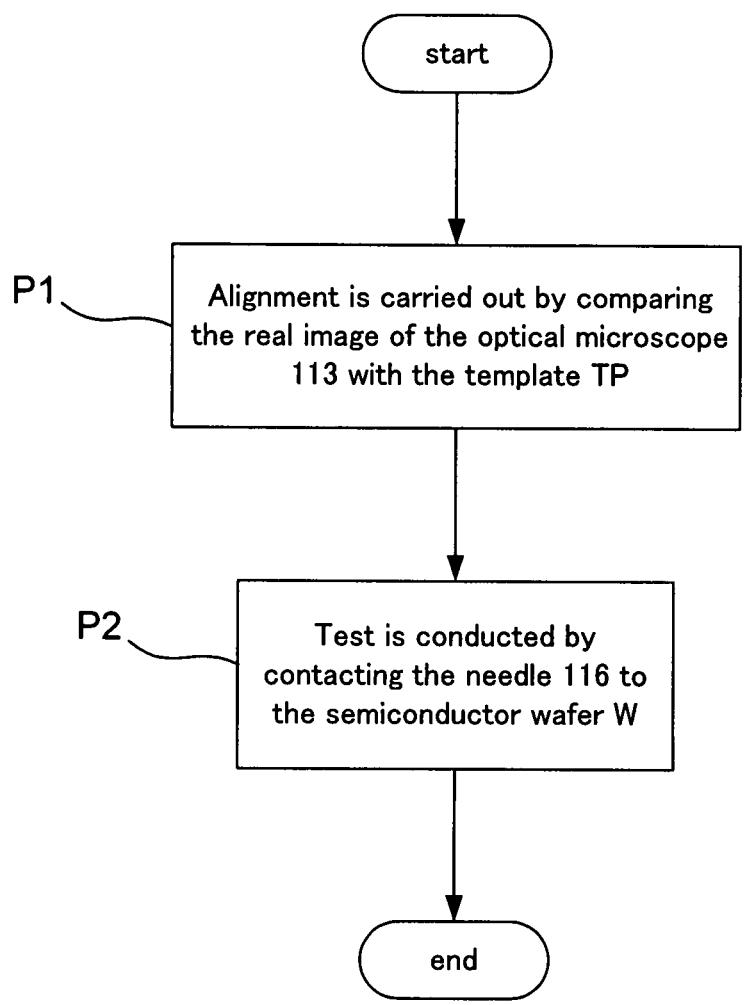
FIG. 4 is a flowchart showing testing steps according to the first embodiment.

Descriptions will be provided for the testing step by referring to FIGS. 3 and 4.

FIG. 3 is a diagram of a configuration of testing equipment used in the testing step. FIG. 4 is a flowchart of the testing step.

As shown in FIG. 3, the testing equipment includes a stage 112 which is provided on an XYZ drive unit 111, and the wafer W as a test object is placed on the stage 112. The stage 112 is capable of moving in the X-axis, Y-axis and Z-axis directions based on a control signal $S_{stage}$ from a controller 115. It should be noted that the stage 12 is also capable of rotating in the X-Y plane. A probe card 114 is arranged above the stage 112 in a way that the probe card 114 is opposing to the wafer W.

The probe card 114 is provided with a needle 116 for applying a test signal $S_{in}$ to a chip. The test signal $S_{in}$ is generated by a test signal generator 117.

An output signal $S_{out}$ from the chip is inputted into a non-defective/defective assessment unit 118 through the probe card 114. Thereafter, the output signal $S_{out}$ is compared with an expectation value from the test signal generator 117. On the basis of this comparison, it is determined whether the chip is non-defective or defective. A result of this determination is stored in a storage unit (not illustrated) in the controller 115.

This testing equipment is provided with an optical microscope 113 which is used for aligning the probe card 114 with the wafer W. A real image taken by this optical microscope 113 is converted to an image signal $S_{image}$, and the image signal $S_{image}$ is inputted into the controller 115.

In the testing step in which the above testing equipment is used, as shown in step P1 of FIG. 4, the probe card 114 of the testing equipment is firstly aligned with the semiconductor wafer W.

Figure 5:
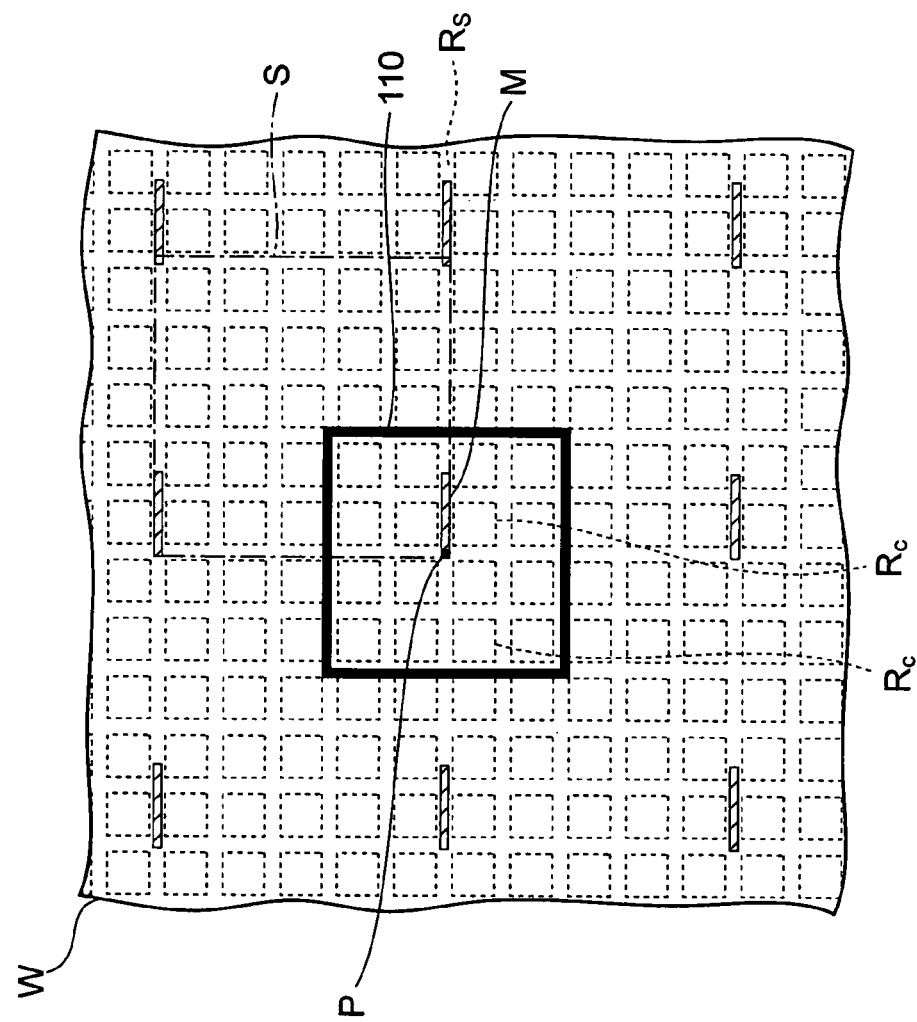
FIG. 5 is a plan view illustrating step P1 shown in FIG. 4.
Figure 5:
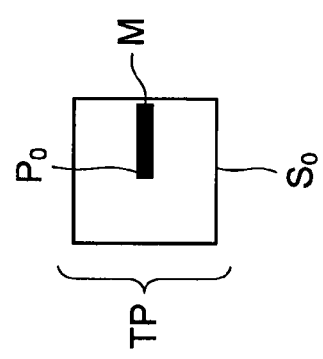

FIG. 5 is a plan view illustrating step P1.

As shown in FIG. 5, a viewing field 110 of the optical microscope 113 is a rectangle encompassing a plurality of chip regions $R_c$. Note that the viewing field 110 is irradiated with an illumination whose light source is a halogen lump, and which has a wavelength of 250 nm to 2400 nm.

When an alignment is carried out, the controller 115 firstly captures an image taken by the optical microscope 113, and the controller 115 compares this real image with a template TP which is stored in the controller 115 in advance.

The template TP includes a virtual small rectangle $S_0$ and a reference mark M. The virtual small rectangle $S_0$ has an origin $P_0$ for alignment in its center. The template TP is constructed from binary data, in which the reference mark is expressed by black and other portion by white. The size and the shape of the virtual small rectangle $S_0$ is predetermined in the testing equipment. The above described comparison of the real image with the template TP is carried out in such a manner that, after binarizing image data on the real image to form a monochrome image, each data on the template and on the real image is compared.

By comparing the template TP with the real image in this manner, it is determined whether or not the reference mark M resides in the viewing field 110.

If it is determined that the reference mark does not reside in the viewing field 110, the stage 112 is moved in the X-axis and the Y-axis directions so that the reference mark M comes to the viewing field 110.

On the other hand, if the reference mark M resides in the viewing field 110, the template TP and the real image is compared with each other. Then, the stage 112 is further moved, so that a reference point P of the reference mark M comes to the center of the viewing field 110, i.e., to the alignment origin $P_0$. Note that end point of the reference mark M is used as the reference point P in the present embodiment.

It does not matter whether the real image taken by the optical microscope 113 is a bright field image or a dark field image. However, when a film made of the same material as the reference mark M is formed under the mark M, the mark M can easily be recognized by employing the dark field.

Through the foregoing step, the alignment of the probe card 114 with the wafer W is completed, and thus step P1 of FIG. 4 is finished.

Thereafter, the process proceeds to step P2, where the needle 116 is contacted to the semiconductor wafer W, and thereby a test is conducted on electrical characteristics of elements, such as the capacitor Q, formed in each chip region $R_c$. This test is firstly performed for the upper left chip of the virtual rectangle S, and then all chips are tested in a manner of "one stroke of a pen".

Since the alignment is precisely carried out in step P1, each chip can be tested in the testing equipment in step P2, while precisely grasping the location of the semiconductor chip, which is under tested, in the semiconductor wafer W.

According to the present embodiment described above, as shown in FIG. 5, the reference mark M formed in the scribe region $R_s$ is used as a clue for aligning the semiconductor wafer W with the probe card 114.

The reference mark M is formed longer than the side of the chip regions $R_c$. Therefore, even in the case where the extremely small chips for IC tags are integrated in the semiconductor wafer W, the reference mark M can be recognized by the testing equipment, so that misalignment and error contact of the needle 116 can be prevented.

In addition, since the reference marks M are formed in scribe regions $R_s$, the same number of chips can be diced out from the semiconductor wafer as in the case where the reference marks M are not formed, and hence it is prevented that the number of the chips diced out from a semiconductor wafer is reduced.

Here, if an attempt is made to form the reference mark M in the stacked films 90 (see FIG. 1Z) in the chip region $R_c$, chip structure varies from the chips with the reference mark M to chips without the reference mark M. Therefore, when the etching condition is optimized for the chips with the reference mark M, films may peel off in the chips without the reference mark M, and hence the yield of the product chips reduces due to the particles originated from the peeled films.

On the contrary, in the present embodiment, since the reference mark M is formed in the scribe region $R_s$, all the chips diced out from the semiconductor wafer have the same structure, so that the decrease in the yield due to the peeled films can be prevented.

Note that the reference marks M have a reflectance large enough for the testing equipment to identify the reference marks M when irradiated with an illumination (whose wavelength is 250 nm to 2400 nm) provided in the testing equipment. According to the experience of the present inventor, it is difficult to see the reference marks M when the reference marks M are made of a metal whose reflectance is less than 30%.

Following table 1 shows data on the reflectance of some metals

TABLE 1

| wave-length $\lambda$ (nm) | Ag | Al | Au | Cu | Ni | Pt | Rh | Sn |
|---|---|---|---|---|---|---|---|---|
| ultra-violet range (280) | 25.2 | 92.3 | 37.8 | 33 | 37.6 | 43.1 | 68.5 | $\lambda = 251$ 17 |
| violet (400) | 94.8 | 92.4 | 38.7 | 47.5 | $\lambda = 361$ 41.2 | $\lambda = 361$ 52.4 | 77.6 | $\lambda = 357$ 17 |
| red (700) | 98.5 | 89.9 | 97 | 97.5 | 68.8 | 69 | 80.4 | — |
| infrared range (1000) | 98.9 | 93.9 | 98.2 | 98.5 | 72 | 77 | 85 | — |

As shown in Table 1, the reflectance of Ag (silver) irradiated with light whose wavelength is 280 nm is less than 30%. Therefore, in the case where the illumination with this wavelength is used, it is desirable that the reference marks M be not made of Ag.

In addition, Sn (tin) has a reflectance of less than 30% when irradiated with light whose wavelengths are 251 nm and 357 nm. Therefore, it is not preferable that the reference marks M be made of Sn.

Any metal listed in Table 1, except for Ag and Sn, has a reflectance of equal to or more than 30% when irradiated with light having any one of the wavelengths listed in Table 1. Thus, even when these metals are used as a material for the reference mark M, testing equipment can recognize the reference mark M.

Moreover, even in the case where a metal used for the reference marks M has a reflectance of equal to or more than 30%, if the thickness of the marks M is thin, films under the reference marks M are seen through the mark M, and hence it is made difficult to identify the reference mark M. Thickness of the reference mark M which facilitates the testing equipment to identify the mark M is equal to or more than 100 nm, and more preferably equal to or more than 500 nm.

(2) Second Embodiment

In the first embodiment, as shown in FIG. 1Z, a reference mark M is formed in the third-layer metal interconnects 60c and 60d constituting the stacked films 90.

The layer in which the reference mark M is formed is not limited to this example. The reference mark M may be formed in any layer of the stacked films 90 as in the following examples 1 to 14.

First Example

Figure 6:
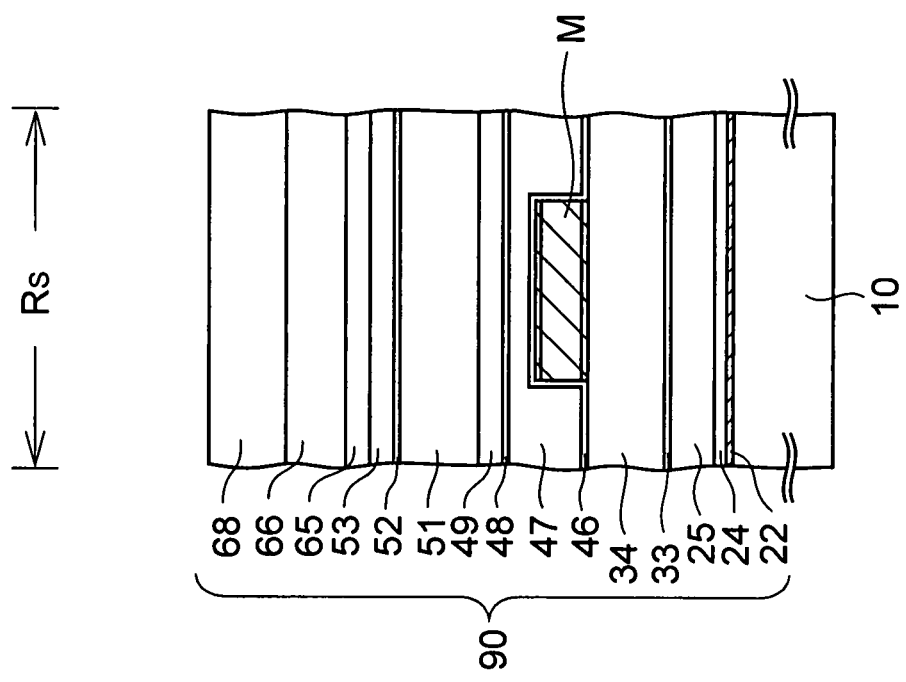
FIG. 6 is a cross-sectional view of a semiconductor wafer according to a first example of a second embodiment.

FIG. 6 is a cross-sectional view of a semiconductor wafer according to a first example. Note that in the following examples, for the purpose of facilitating the understanding of the drawings, only the cross section of the semiconductor wafer in the scribe region $R_s$ is shown, and cross section in the chip region $R_c$ will be omitted As shown in FIG. 6, the reference mark M is formed in the first-layer metal interconnects 41a and 41b (see FIG. 1N) in the present example.

It should be noted that, although the first to third capacitor protection insulating films 46, 48 and 52 made of alumina are formed above the reference mark M, it is possible for the testing equipment to identify the reference mark M, since these insulating films 46, 48 and 52 are extremely thin and transmit light.

Even when the reference mark M is provided at a middle height of the stacked films, if the films of the stacked films 90 above the reference mark M are made of transparent films, it is possible for the testing equipment to identify the reference mark M.

Second Example

Figure 7:
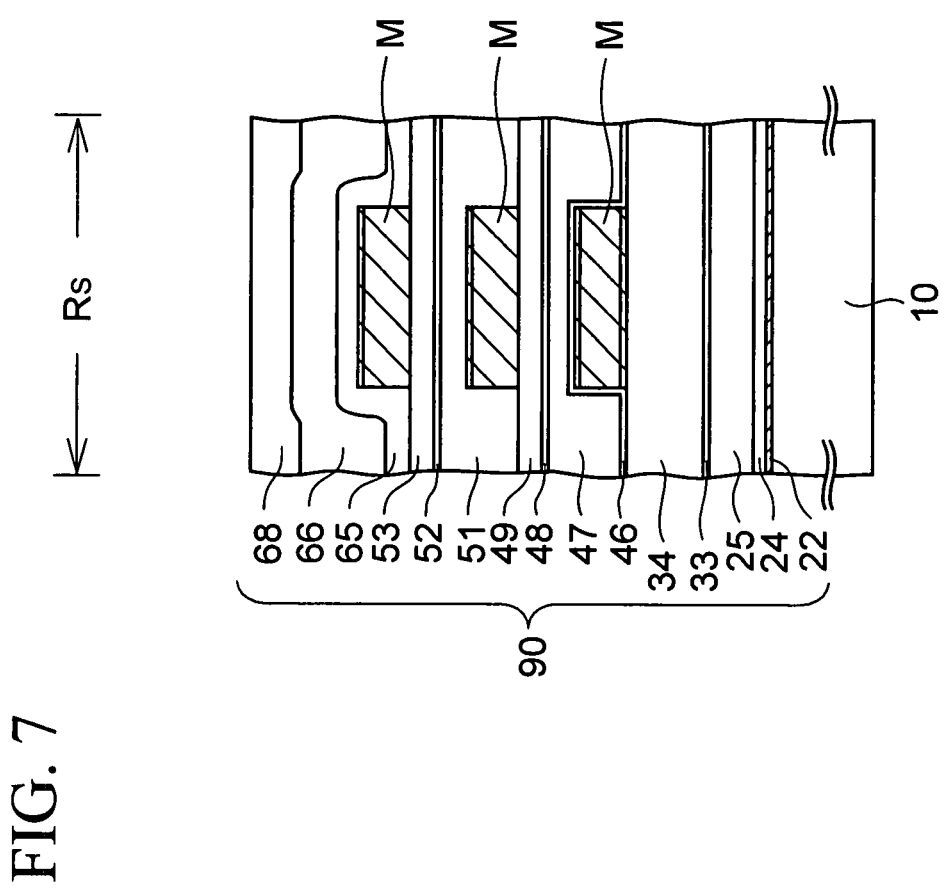
FIG. 7 is a cross-sectional view of a semiconductor wafer according to a second example of the second embodiment.

FIG. 7 is a cross-sectional view of a semiconductor wafer according to a second example.

In the present example, three reference marks M are formed respectively in the first-layer interconnects 41a and 41b, the second-layer interconnects 55a, and the third-layer interconnects 60c and 60d in a way that the three reference marks M overlaps with one another.

The three reference marks M have the same planer shape. When viewing the three reference marks M from above, the three reference marks M look as if only a single reference mark were formed.

Note that the three reference marks M do not have to be overlaps with one another exactly, and the reference marks M may be slightly shifted.

Third Example

Figure 8:
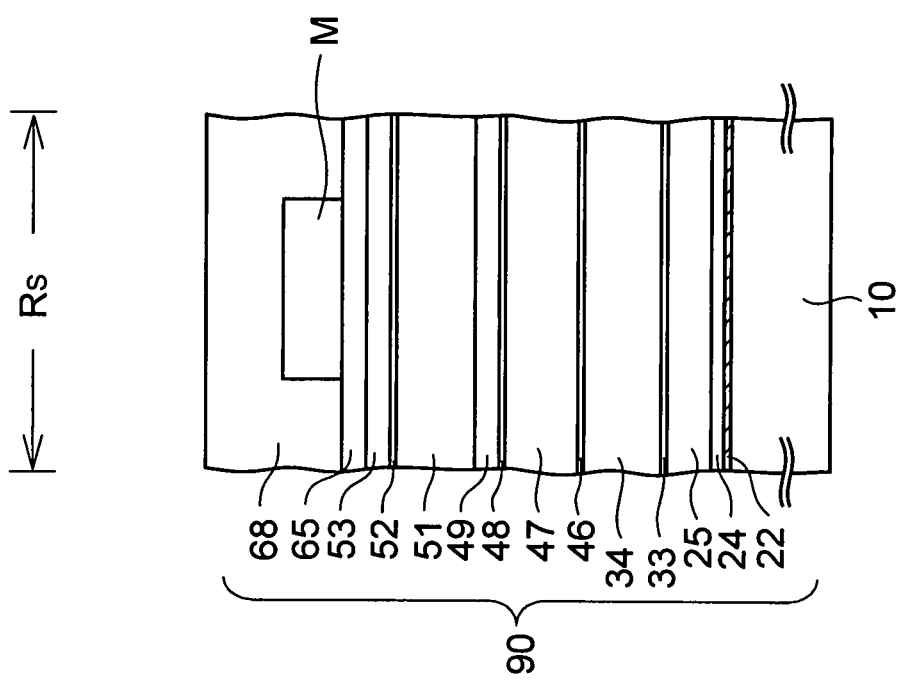
FIG. 8 is a cross-sectional view of a semiconductor wafer according to a third example of the second embodiment.

FIG. 8 is a cross-sectional view of a semiconductor wafer according to a third example.

In the present example, a reference mark M is formed in the second passivation film 66 (see FIG. 1Z).

The second passivation film 66 is made of silicon nitride. Therefore, the second passivation film 66 is different in refractive index from the protection film 68 made of polyimide and the first passivation film 65 made of silicon oxide. Accordingly, the reference mark M can be recognized in the testing equipment.

Fourth Example

Figure 9:
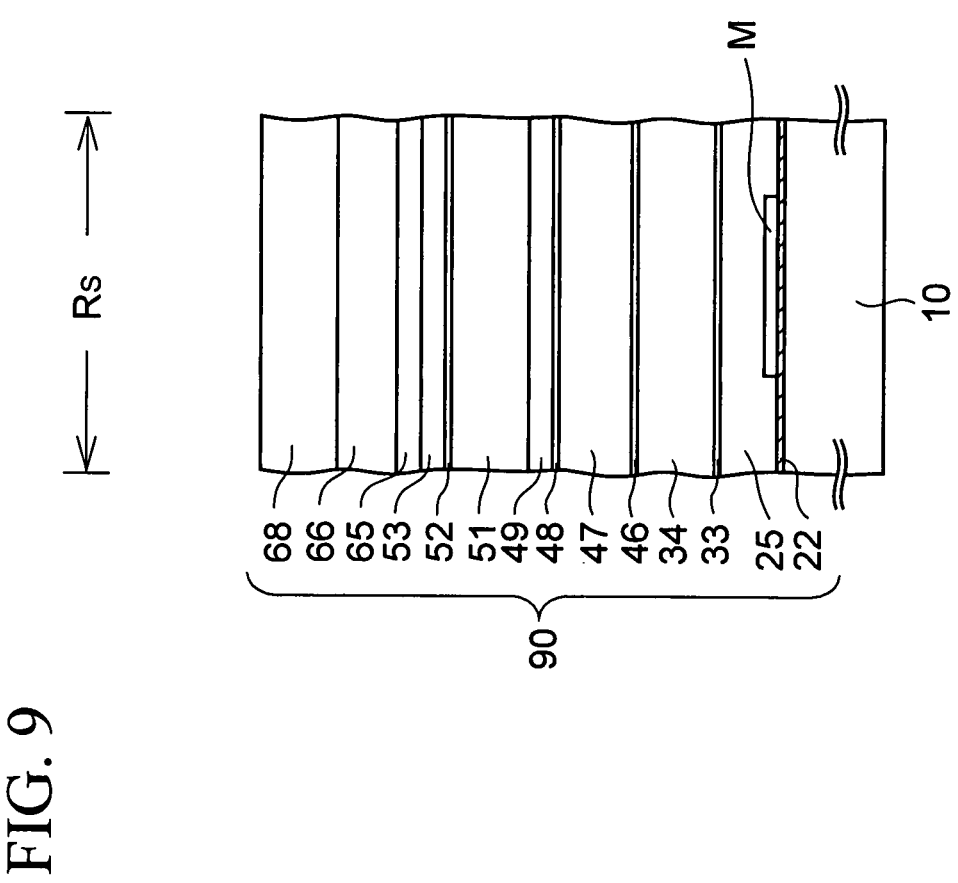
FIG. 9 is a cross-sectional view of a semiconductor wafer according to a fourth example of the second embodiment.
Figure 10:
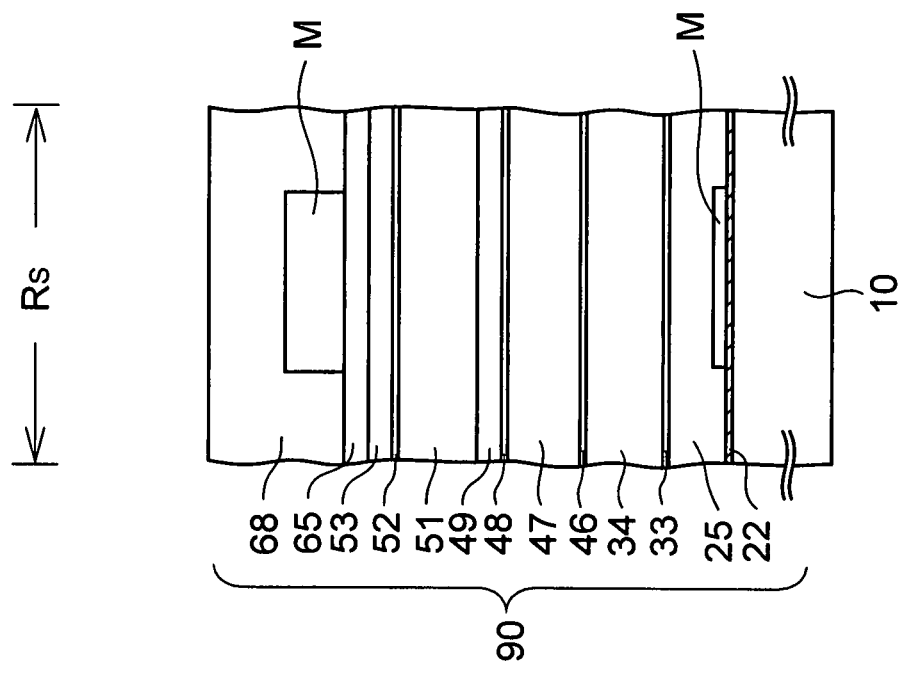

FIG. 9 is a cross-sectional view of a semiconductor wafer according to a fourth example.

In the present example, a reference mark M is formed in the cover insulating film 24 (see FIG. 1B) covering the gate electrodes 15 of the MOS transistors $TR_1$ and $TR_2$.

The cover insulating film 24 is made of silicon nitride, and is accordingly different in refractive index from the neighboring films. This makes it possible for the testing equipment to recognize the reference mark M as in the case of the third example.

Fifth Example

FIG. 10 is a cross-sectional view of a semiconductor wafer according to a fifth example.

In the present example, two reference marks M are formed in both of the second passivation film 66 and the cover insulating film 24 in such a manner that the two reference marks M overlaps with each other.

If the single transparent reference mark M made of silicon nitride is formed alone as in the case of the third and fourth examples, the reference mark M and its neighbor exhibit low contrast difference. However, by overlapping the two reference marks M, testing equipment can easily recognize the marks M.

6th Example

Figure 11:
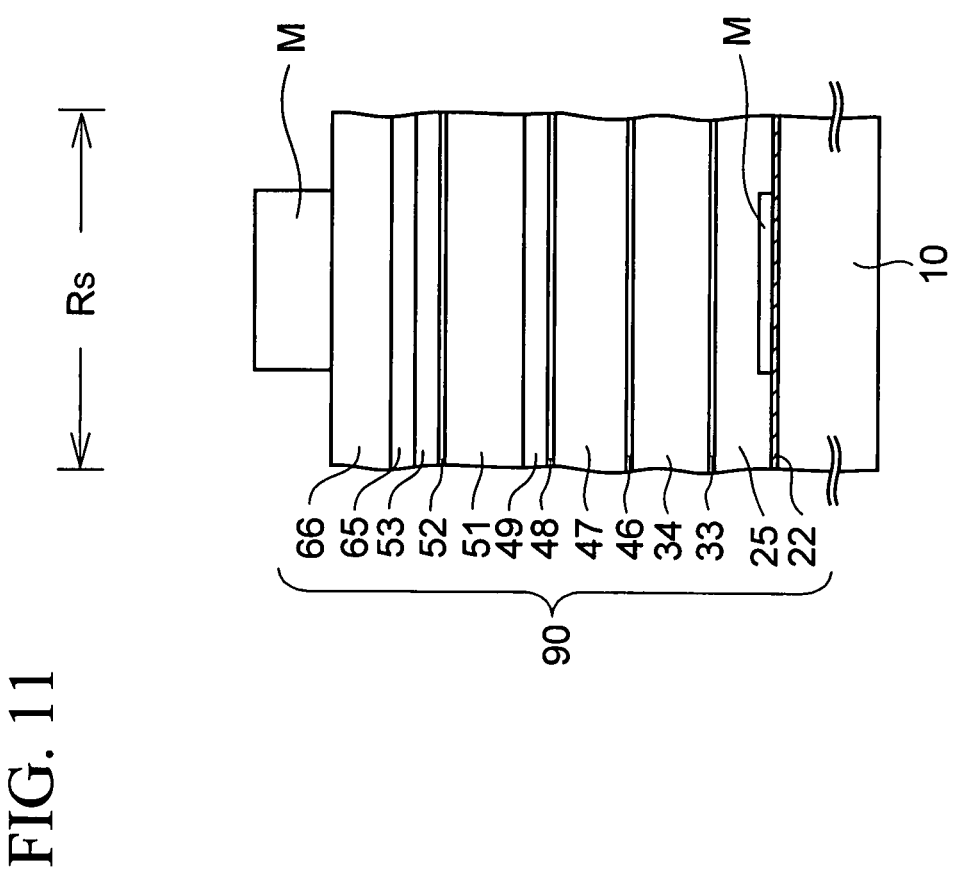
FIG. 11 is a cross-sectional view of a semiconductor wafer according to a 6th example of the second embodiment.

FIG. 11 is a cross-sectional view of a semiconductor wafer according to a 6th example.

In the present example, reference marks M are formed respectively in the polyimide protection film 68 and in the cover insulating film 24 in a manner that the two reference marks M overlap with each other. Note that the polyimide protection film 68 is the uppermost film out of the films constituting the stacked films 90.

Similar to the fifth example, since the reference mark M formed in the polyimide protection film 68 is transparent, it is difficult to make a contrast between the reference mark M and its neighbors, as long as the single reference mark M is used alone. To deal with such a circumstance, in the present example, the two reference marks M is formed to overlap with each other as in the fourth example, so that the reference marks M can be easily seen. Noted that, in the case where it is sufficiently easy for the testing equipment to recognize the reference mark M formed in the polyimide protection film 68, the reference mark M formed in the cover insulating film 24 may be omitted.

In addition, since one of the two reference marks M is formed in the uppermost film, the reference mark M is not obstructed by other films, and hence the reference mark M can easily be recognized by the testing equipment.

7th Example

Figure 12:
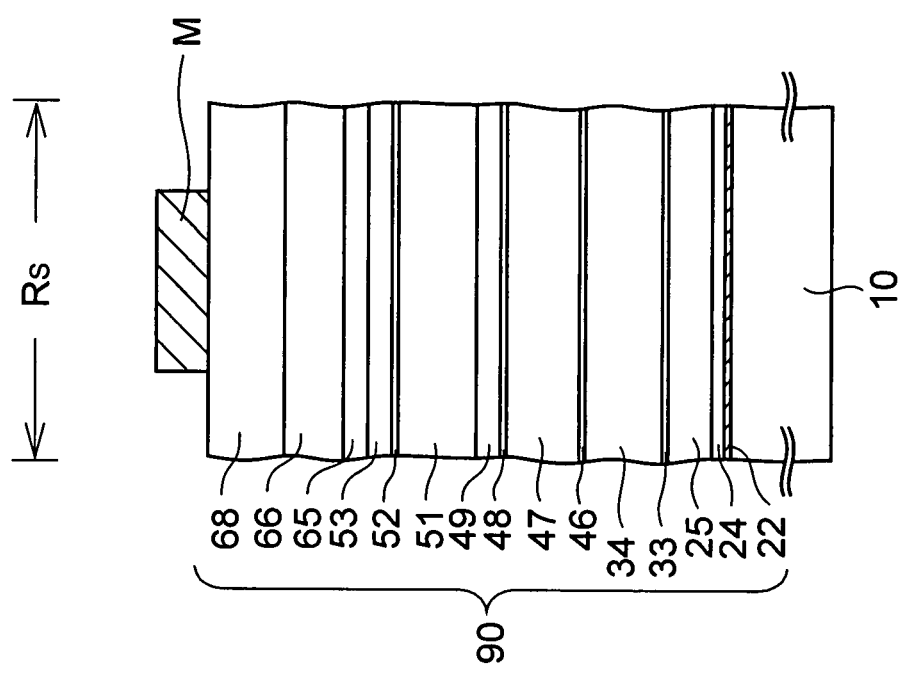
FIG. 12 is a cross-sectional view of a semiconductor wafer according to a 7th example of the second embodiment.

FIG. 12 is a cross-sectional view of a semiconductor wafer according to a 7th example.

In the present example, the reference mark M is formed on the polyimide protection films 68 constituting the stacked films 90. In this case, the reference mark M is formed by patterning a metal laminated film which is formed on the stacked films 90 by sputtering. The metal laminated film is formed by stacking a titanium nitride film, a copper-containing aluminum film and a titanium nitride film in this sequence. Note that the uppermost titanium nitride film functions as an anti-oxidizing film.

When the reference mark M is formed on the stacked films 90 and no other film is formed on the reference mark M in this manner, the reference mark M is not obstructed by other film.

Therefore, the reference mark M can be more easily recognized than the first to sixth examples.

It should be noted that this metal laminated film is provided only for the purpose of forming the reference mark M. Therefore, the metal laminated film is not needed for maintaining functions of elements formed in the chip regions $R_c$, so that the number of the steps increases than the other examples by the steps of forming the metal laminated film and of patterning thereof. Thus, the other examples have an advantage that the number of steps decreases than in the present example by the steps of forming the metal laminated film and of patterning thereof.

In addition, in the other examples, the scribe regions $R_s$ have the same layer structure as the chip regions $R_c$, since the reference marks are provided by use of one layer constituting the stacked films 90 essential for the chip regions $R_c$. In contrast, in the present example, the scribe regions $R_s$ have a different layer structure than that of the chip regions $R_c$, since the metal laminated film for the reference mark M is formed only in the chip regions $R_c$.

When a film constituting the stacked films 90 is to be etched, etching conditions are usually optimized for the chip regions $R_c$, and the scribe regions $R_s$ are etched under such an etching conditions. Therefore, if the layer structures are different in the chip regions $R_c$ and the scribe regions $R_s$ as in the above, it is likely that parts of the film may peel off from the scribe regions $R_s$ for which the etching conditions do not meet. In the present example, however, it suffices that the reference marks M are left only in the scribe regions $R_s$, and hence etching conditions can be set up to meet the metal laminated film in the scribe regions $R_s$. This makes it possible to prevent parts of the metal laminated film from peeling off from the chip regions $R_c$ and from thus presenting a cause of particles, which would otherwise occur when the reference marks M are formed by etching the metal laminated film.

In the present example, reference marks M may be provided in the chip regions $R_c$. Even when the reference marks M are provided in the chip regions $R_c$ in this manner, since the circuit pattern in the chip regions $R_c$ is insulated from the reference marks M by the polyimide protection film 68, the circuit pattern in the chip region $R_c$ is not interfered by the reference marks M. Therefore, the semiconductor chips in which the reference marks M are formed can be shipped as products, and hence the number of chips diced out from the semiconductor wafer W does not decrease.

8th Example

Figure 13:
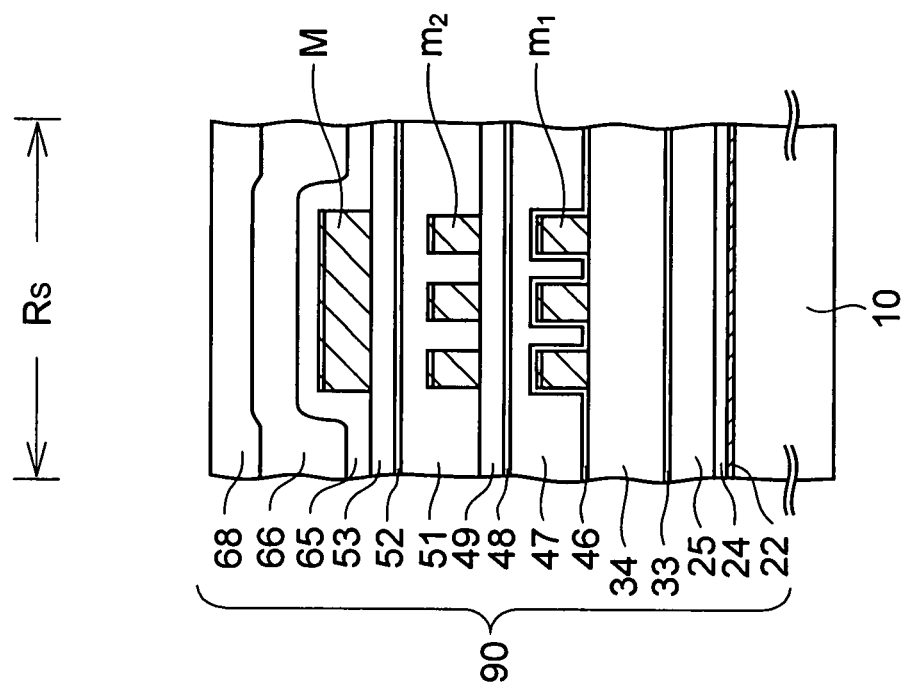
FIG. 13 is a cross-sectional view (part 1) of a semiconductor wafer according to an 8th example of the second embodiment.
Figure 14:
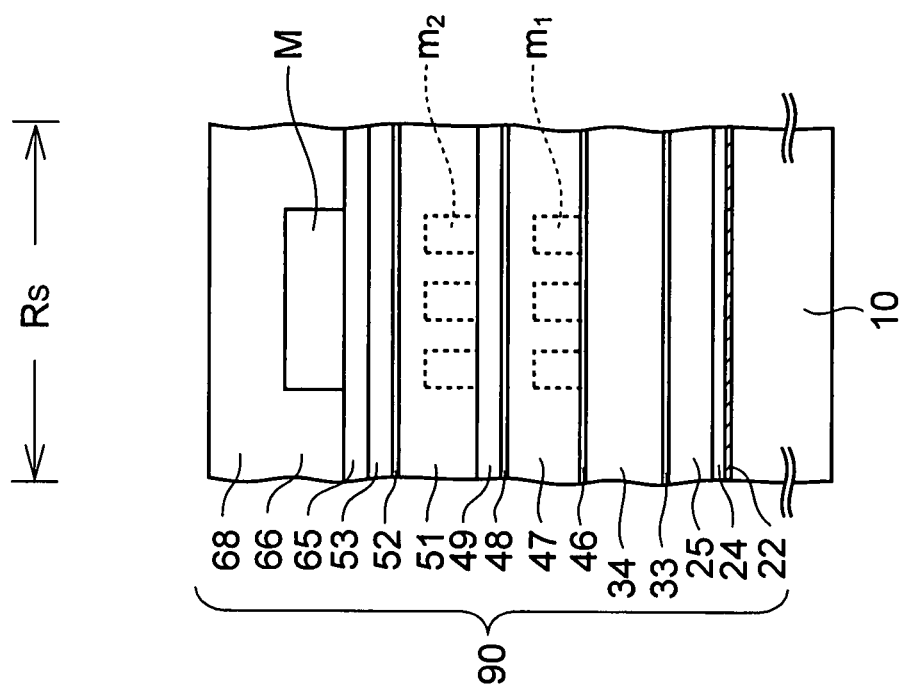
FIG. 14 is a cross-sectional view (part 2) of the semiconductor wafer according to the 8th example of the second embodiment.

FIGS. 13 and 14 are cross-sectional views each showing a semiconductor wafer according to an 8th example.

In the steps of manufacturing a semiconductor device, marks $m_1$ and $m_2$ are formed for the purpose of aligning the semiconductor substrate 10 with an exposure system, in addition to the reference marks M for aligning the semiconductor wafer with the testing equipment.

Even in the case where such marks $m_1$ and $m_2$ are present, if the reference marks M are formed in the third-layer metal interconnects 60c and 60d in a manner that the marks $m_1$ and $m_2$ are covered with the marks M, testing equipment can recognize the reference mark M as the clue for the alignment at the time of electrical test, and the marks $m_1$ and $m_2$ are not recognized by the testing equipment.

However, as shown in FIG. 14, in the case where the reference mark M is formed in the transparent second passivation film 66 made of silicon nitride, the marks $m_1$ and $m_2$ are seen through the reference mask M, if the marks $m_1$ and $m_2$ are present under the reference mark M. This poses such a problem that alignment may possibly not be carried out in the testing equipment. In this case, therefore, it is preferable that the marks $m_1$ and $m_2$ are not formed under the reference mark M.

9th Example

Figure 15:
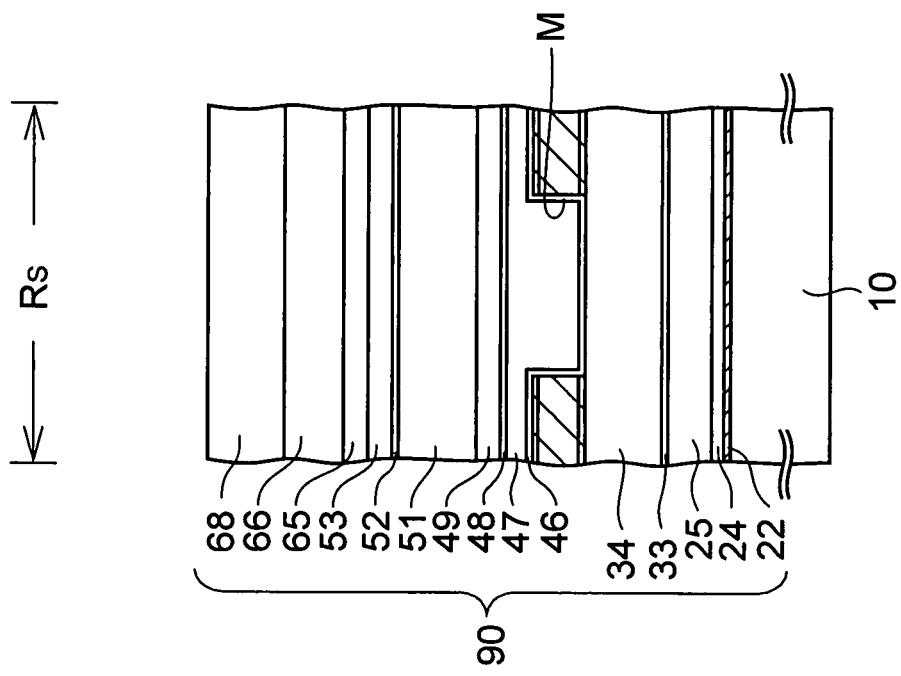
FIG. 15 is a cross-sectional view of a semiconductor wafer according to a 9th example of the second embodiment.

FIG. 15 is a cross-sectional view of a semiconductor wafer according to a 9th example.

In the first to 8th examples, the remaining part of a film constituting the stacked films 90 is used as the reference mark M.

In contrast, in the present example, as shown in FIG. 15, an opening is formed in the first-layer metal interconnect 41a which shields light, and this opening is used as the reference mark M. Such a reference mark M may be formed in any light shielding film other than the first-layer metal interconnect 41a However, as in the 8th example shown in FIG. 13, if the other marks $m_1$ and $m_2$ are present under the reference mark M, the marks $m_1$ and $m_2$ is seen from the opening that constitutes the reference mark M, so that the reference mark M cannot correctly be recognized in the testing equipment. Therefore, it is preferable to form the reference mark M in a manner that the reference mark M does not overlap with the marks $m_1$ and $m_2$.

10th Example

Figure 16:
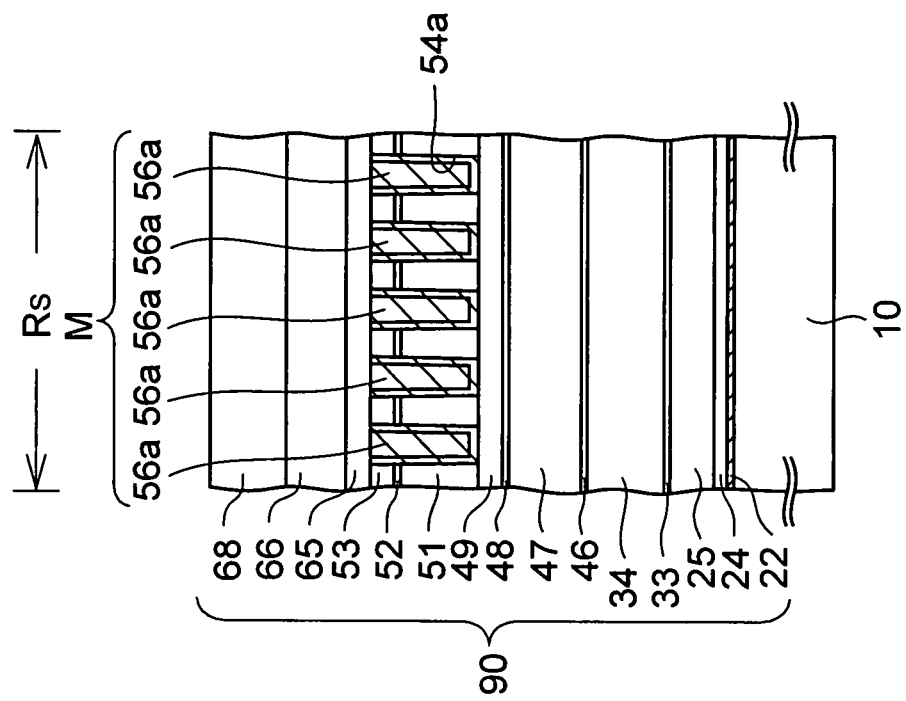
FIG. 16 is a cross-sectional view of a semiconductor wafer according to a 10th example of the second embodiment.

FIG. 16 is a cross-sectional view of a semiconductor wafer according to a 10th example.

In the present example, a plurality of second conductive plugs 56a (see FIG. 1U) is formed in the scribe region $R_s$, and the reference mark M is constructed from an aggregation of these second conductive plugs 56a.

Figure 17:
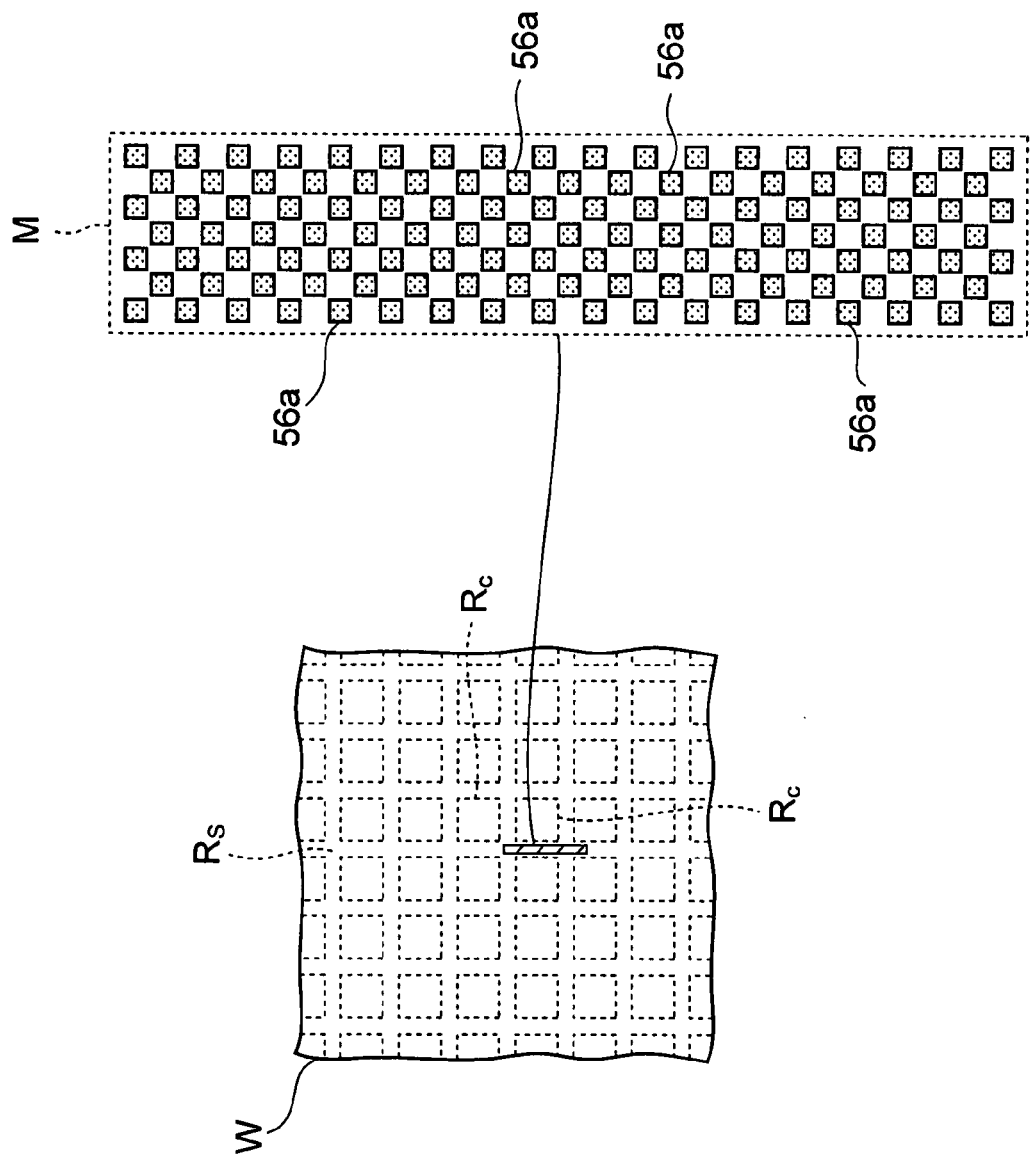
FIG. 17 is an enlarged, plan view of the semiconductor wafer according to the 10th example of the second embodiment.

FIG. 17 is an enlarged plan view of this semiconductor wafer.

As shown in FIG. 17, the plurality of second conductive plugs is arranged in a staggered manner. It is preferable that the pitch between the adjacent second conductive plugs 56a be shorter than the resolving power of the optical microscope 113. By employing such a pitch, the image of the reference mark M obtained by the optical microscope 113 looks as if the mark M is solid pattern, so the mark M can be well recognized as in the case where the solid reference mark M is formed.

11th Example

Figure 18:
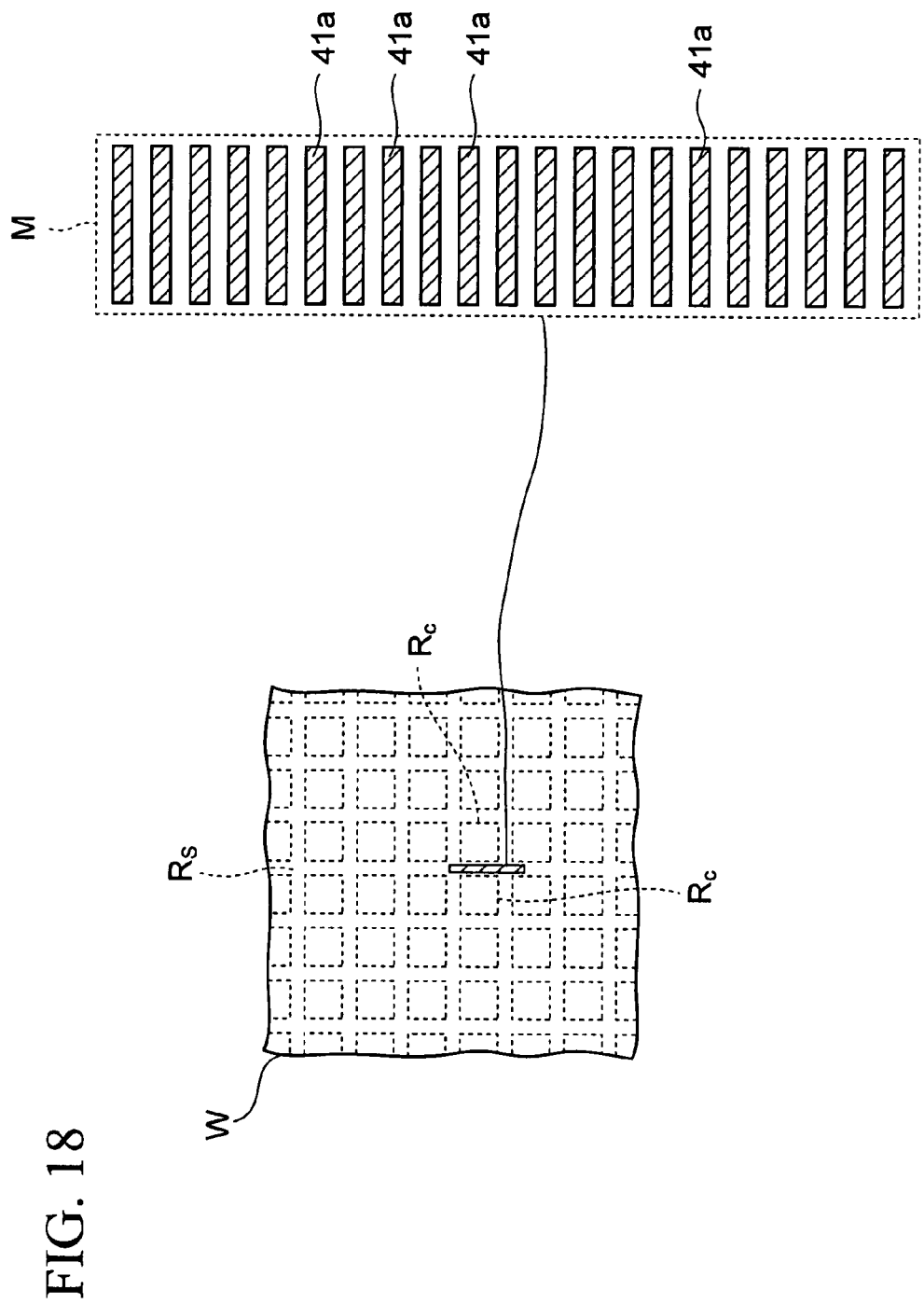
FIG. 18 is an enlarged, plan view (part 1) of a semiconductor wafer according to an 11th example of the second embodiment.
Figure 19:
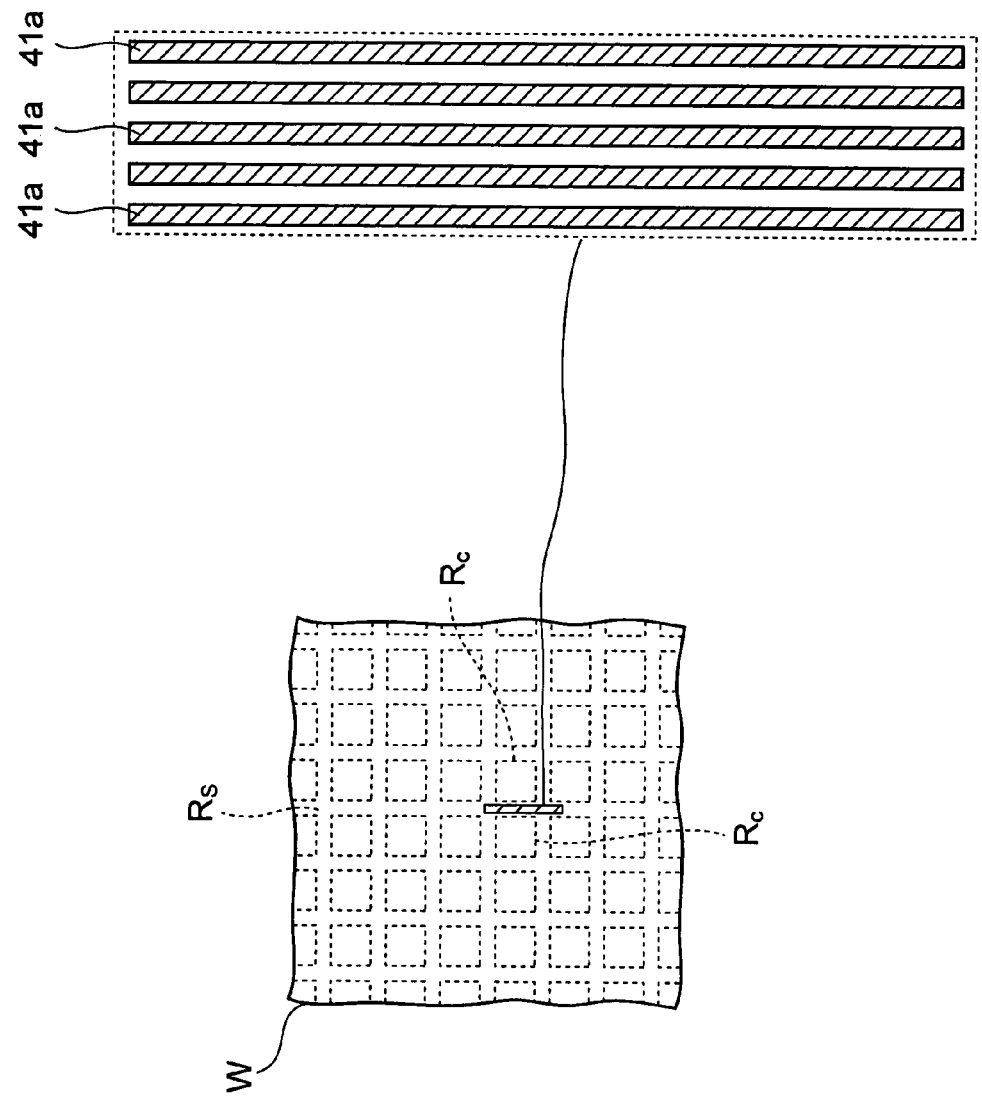
FIG. 19 is an enlarged, plan view (part 2) of the semiconductor wafer according to the 11th example of the second embodiment.

FIGS. 18 and 19 are enlarged plan views of a semiconductor wafer according to an 11th example.

In the first example explained in FIG. 6, solid reference mark M is formed in the first-layer metal interconnect 41a.

In contrast, in the present example, as shown in FIG. 18, a plurality of first-layer metal interconnects 41a of stripe-shape is formed at a distance from each other in the scribe region $R_s$, and an aggregation of the metal interconnects 41a is used as the reference mark M.

In the present example, it is preferable that the pitch between the adjacent metal interconnects 41a in the scribe region $R_s$ be shorter than the resolving power of the optical microscope 113, in order that the image of the reference mark M obtained by the optical microscope 113 looks like a solid image, as in the case of the 10th example.

Although the first-layer metal interconnects 41a are formed in the horizontal stripes in FIG. 18, the first-layer metal interconnects 41a may be formed in the vertical stripes as shown in FIG. 19.

12th Example

Figure 20:
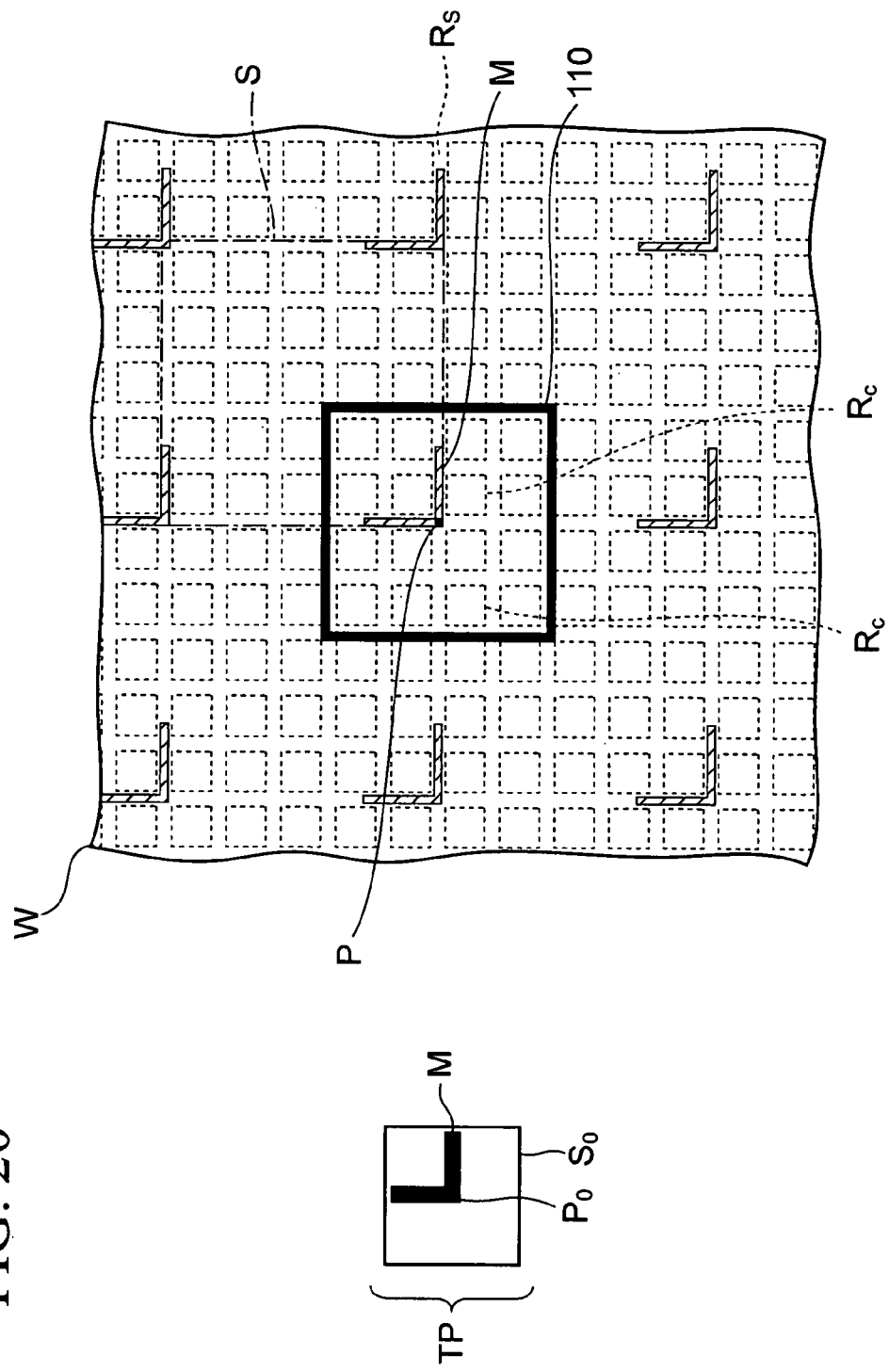
FIG. 20 is an enlarged, plan view of a semiconductor wafer according to a 12th example of the second embodiment

FIG. 20 is an enlarged plan view of a semiconductor wafer according to a 12th example.

In the first embodiment, the planer shape of the reference mark M is linear shape as shown in FIG. 2.

On the other hand, in the present example, the reference mark M is formed in L-shape as shown in FIG. 20.

If the reference mark M is formed in this manner, occupying ratio of the area of the dark reference mark M in the viewing field 110 of the optical microscope increases, so that the alignment can easily be performed.

According to the experience of the present inventor, alignment can most easily be performed when the occupying ratio of area of the reference mark M in the template TP is 50%.

13th Example

Figure 21:
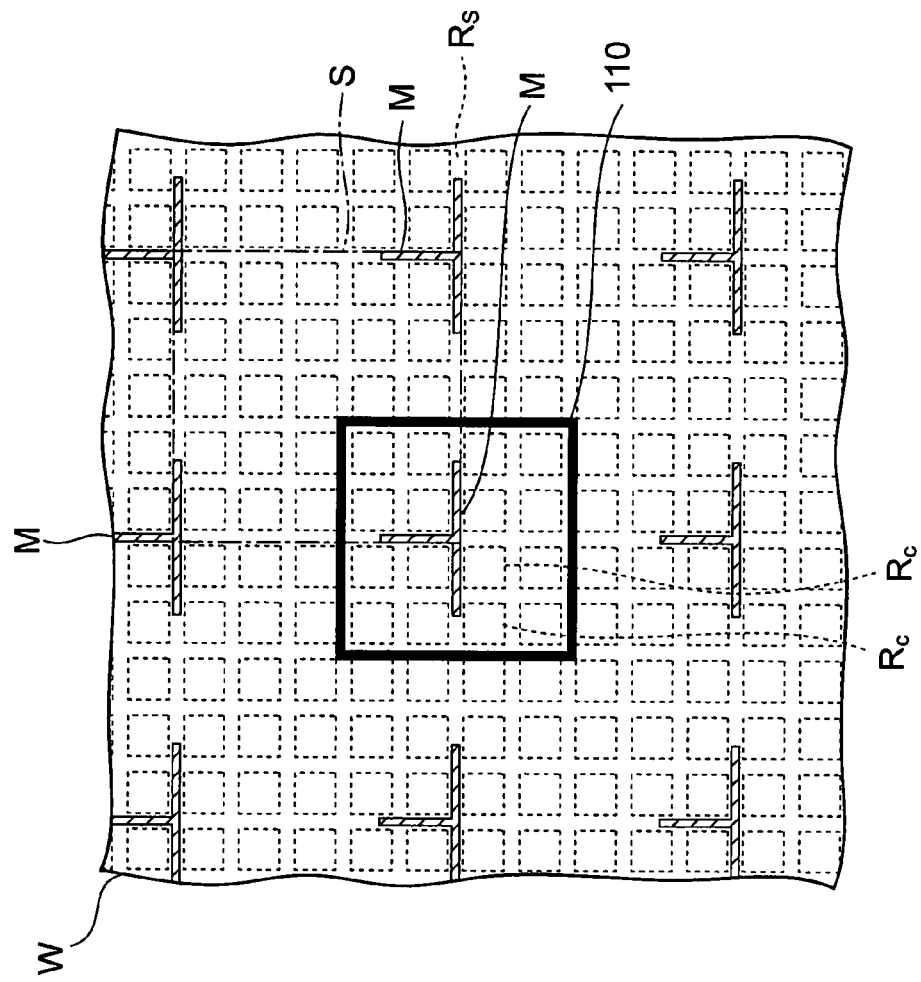
FIG. 21 is an enlarged, plan view of a semiconductor wafer according to a 13th example of the second embodiment.
Figure 21:
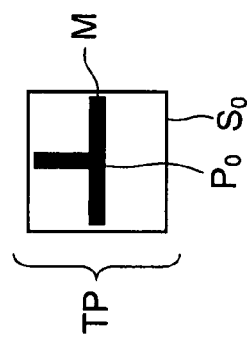

FIG. 21 is an enlarged plan view of a semiconductor wafer according to a 13th example.

In the present example, the planer shape of the reference marks M is made into T-shape. By forming the reference mark M in this manner, occupying ratio of the area of the reference mark M in the viewing field 110 more increases, so that the alignment can more easily be performed in the testing equipment.

14th Example

Figure 22:
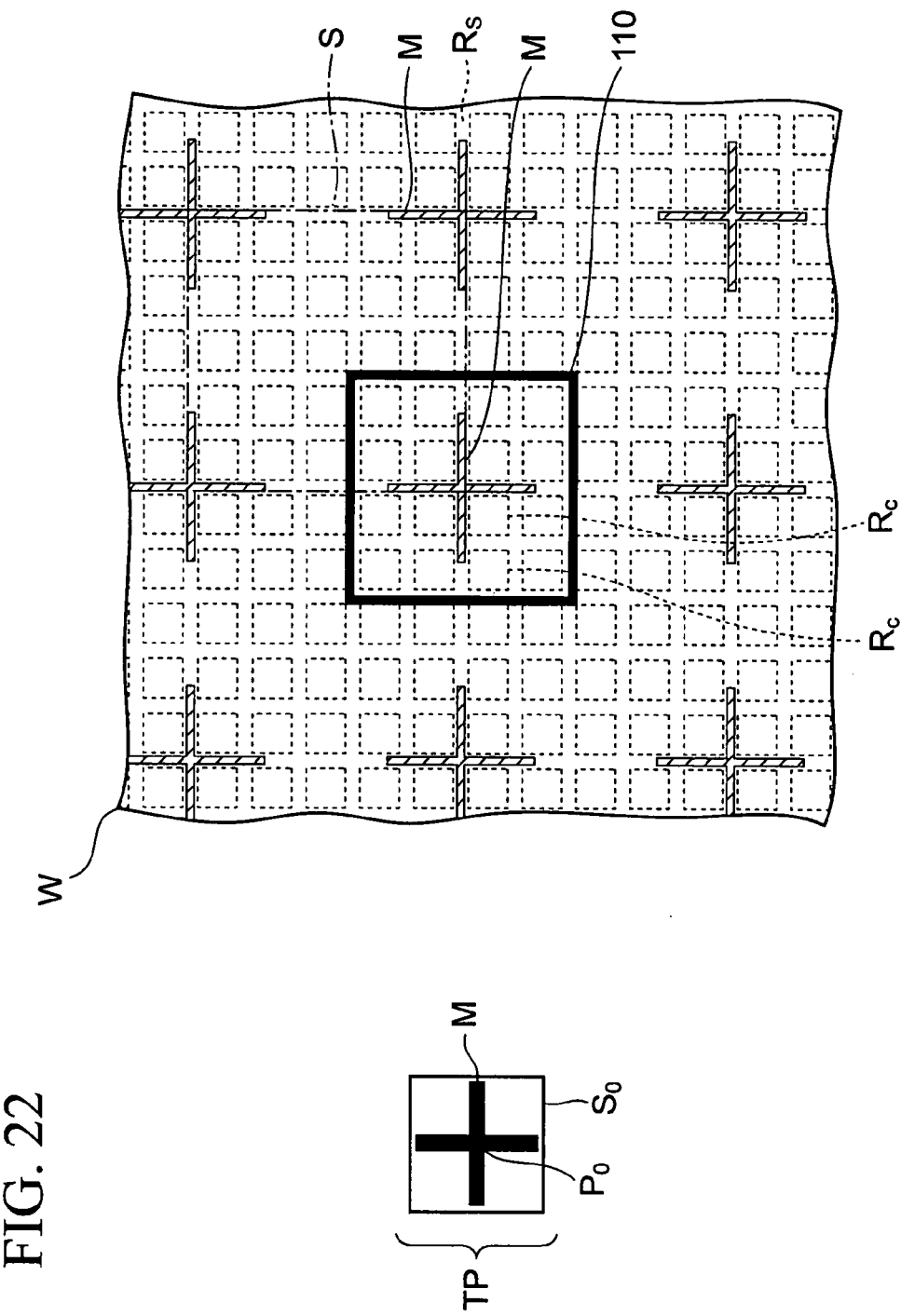
FIG. 22 is an enlarged, plan view of a semiconductor wafer according to a 14th example of the second embodiment

FIG. 22 is an enlarged plan view of a semiconductor wafer according to a 14th example.

In the present example, the planer shape of the reference mark M is made into cross-shape. Thus, the occupying ratio of the area of the reference mark M in the viewing field 110 is more increased, and hence the alignment can easily be performed.

15th Example

In the first embodiment described above, the probe card 114 is aligned with the wafer W in the X-axis and Y-axis direction. However, a rotational shift of the wafer W can also be corrected by using the reference marks M.

Figure 23:
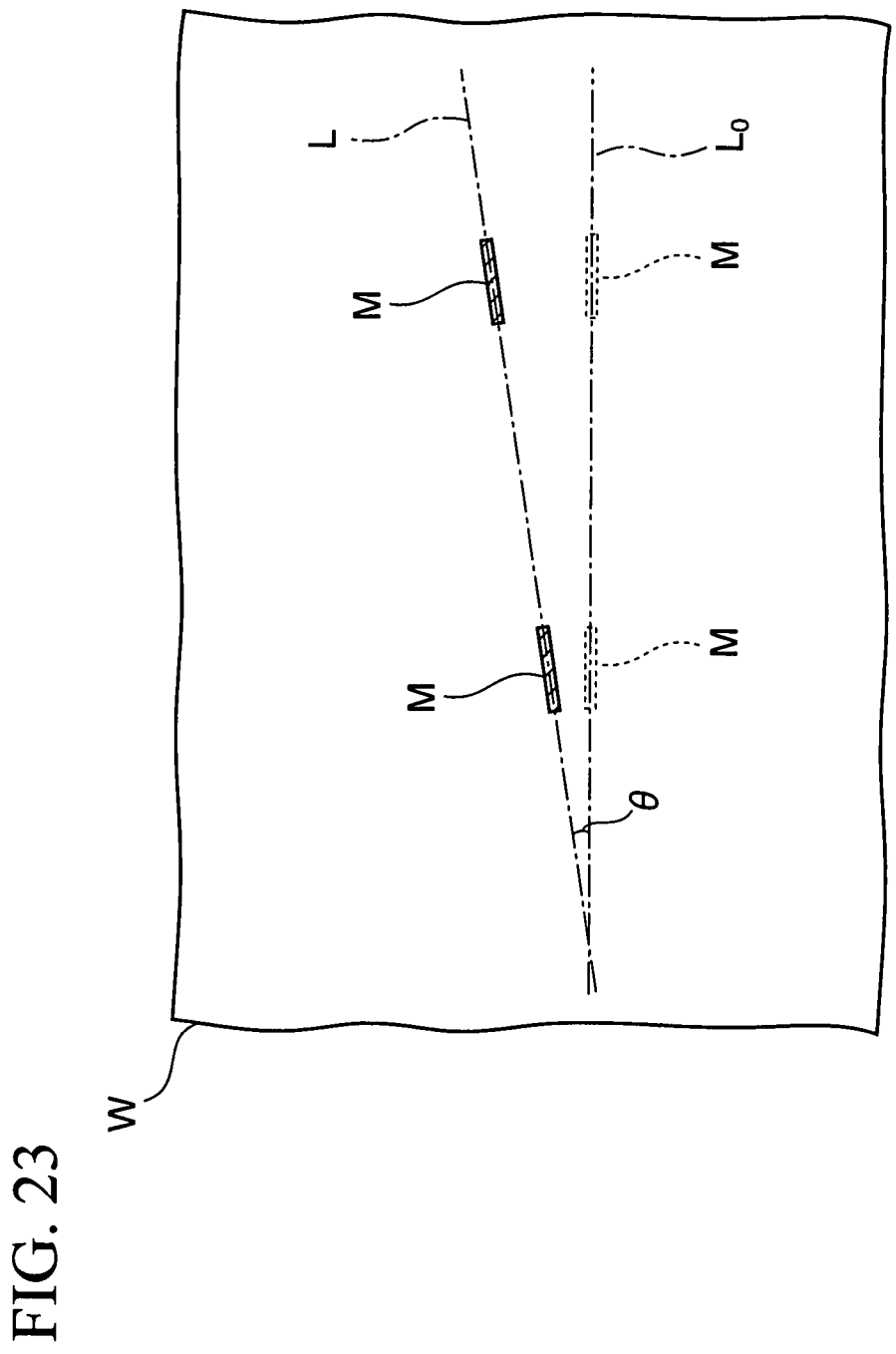
FIG. 23 is a plan view of illustrating a method of correcting a rotational shift of a semiconductor wafer according to a 15th example of the second embodiment.

FIG. 23 is a plan view showing a method of correcting the rotational shift.

In an example shown in FIG. 23, the wafer W shifts by an angle θ from the direction in which the wafer W is expected to be oriented. This rotational shift is detected as follows. First, the testing equipment recognizes two reference marks M, and checks on whether or not the centers of the respective marks M are located on a line (reference line) $L_0$ on which the centers of the respective marks M are expected to be located when there is no rotational shift.

In the case where the rotational shift is detected, the testing equipment performs the step of calculating an angle θ between the line $L_0$ and the line L passing through the two reference marks M, and then correcting the rotational shift by rotating the stage 112 by the angle θ in the X-Y plane. This step may be carried out before or after step P1 of FIG. 4.

In the present embodiment, the reference marks used as a clue for aligning the semiconductor wafer with the testing equipment are formed longer than one side of the chip region as described above. This makes it possible for the testing equipment to clearly recognize the reference mark, and to accordingly align the testing equipment with the semiconductor wafer precisely, even in the case where extremely small semiconductor chips are formed in the semiconductor wafer.

What is claimed is:

1. A semiconductor wafer comprising:
    a semiconductor substrate including chip regions and a scribe region;
    stacked films formed on the semiconductor substrate; and
    a plurality of reference marks formed in at least one of the films of the stacked films and located in the scribe region,
    wherein
    the reference marks are arranged in a first direction in planar view,
    a length of each of the reference marks in the first direction is longer than one side of the chip region in the first direction in planar view,
    the reference marks include a first reference mark and a second reference mark that is next to the first reference mark in the first direction in planar view,
    the first reference mark is spaced from the second reference mark by a length that is longer than the one side of the chip region in the first direction in planar view, and
    there is no additional reference mark between the first reference mark and the second reference mark.

2. The semiconductor wafer according to claim 1, wherein each of the reference marks is arranged in the scribe region.

3. The semiconductor wafer according to claim 1, wherein each of the reference marks has such a film thickness that a contrast between the reference mark and its neighbor is generated when the reference mark is irradiated with light with a wavelength of 250 nm to 2400 nm.

4. The semiconductor wafer according to claim 3, wherein the film thickness is not less than 100 nm.

5. The semiconductor wafer according to claim 1, wherein each of the reference marks is formed by a metal layer constituting the stacked films.

6. The semiconductor wafer according to claim 1, wherein a planar shape of each of the reference marks is any one of L-shape, T-shape, and cross-shape.

7. The semiconductor wafer according to claim 1, wherein each of the reference marks includes a plurality of conductive plugs.

8. The semiconductor wafer according to claim 1, wherein the stacked films include an interlayer insulating film and transparent films formed on the interlayer insulating film, and
the reference marks are formed in the interlayer insulating film.

9. The semiconductor wafer according to claim 1, wherein an uppermost film of the stacked films is a polyimide protection film, and
the reference marks are formed on the polyimide protection film.

10. The semiconductor wafer according to claim 1, wherein each of the reference marks includes a plurality of metal interconnects.

* * * * *